(12) United States Patent
Ismail

(10) Patent No.: US 10,996,540 B2
(45) Date of Patent: May 4, 2021

(54) COMPACT ALPHA-BBO ACOUSTO-OPTIC DEFLECTOR WITH HIGH RESOLVING POWER FOR UV AND VISIBLE RADIATION

(71) Applicant: Mycronic AB, Täby (SE)

(72) Inventor: Nur Ismail, Stockholm (SE)

(73) Assignee: Mycronic AB, Taby (SE)

( * ) Notice: Subject to any disclaimer, the term of this patent is extended or adjusted under 35 U.S.C. 154(b) by 388 days.

(21) Appl. No.: 16/160,939

(22) Filed: Oct. 15, 2018

(65) Prior Publication Data
US 2019/0331981 A1 Oct. 31, 2019

Related U.S. Application Data

(60) Provisional application No. 62/663,252, filed on Apr. 26, 2018.

(51) Int. Cl.
*G02F 1/33* (2006.01)
*G02F 1/29* (2006.01)
*G03F 7/20* (2006.01)

(52) U.S. Cl.
CPC ........... *G02F 1/332* (2013.01); *G02F 1/33* (2013.01); *G02F 1/292* (2013.01); *G02F 2203/22* (2013.01); *G03F 7/7015* (2013.01)

(58) Field of Classification Search
CPC ........ G02F 1/332; G02F 1/33; G02F 2203/22; G02F 1/292; G03F 7/7015
USPC .................................................. 359/305–314
See application file for complete search history.

(56) References Cited

U.S. PATENT DOCUMENTS

| 7,709,165 B2 | 5/2010 | Ekberg |
| 8,144,307 B2 | 3/2012 | Sandstrom |
| 8,891,157 B2 | 11/2014 | Sandstrom |
| 8,896,909 B2 | 11/2014 | Sandstrom et al. |
| 8,958,052 B2 | 2/2015 | Sandstrom |
| 2004/0090660 A1* | 5/2004 | Minemoto ............ G02F 1/0009 359/305 |
| 2015/0331205 A1 | 11/2015 | Tayebati et al. |

FOREIGN PATENT DOCUMENTS

| TW | 202001393 | * | 1/2020 | ............... G02F 1/33 |
| WO | WO2019/207064 | * | 10/2019 | ............... G02F 1/33 |

OTHER PUBLICATIONS

Saleh et al. "Fundamental of Photonics" pp. 815-817 (Year: 1991).*
(Continued)

*Primary Examiner* — George G King
(74) *Attorney, Agent, or Firm* — Haynes Beffel & Wolfeld, LLP; Ernest J. Beffel, Jr.

(57) ABSTRACT

The technology disclosed relates to developing an acousto-optic device (AOD) using an alpha-barium borate (αBBO) crystal. An AOD using αBBO enables high-resolution microlithographic patterning. The AOD includes a slab of αBBO coupled to an RF transducer that drives an acoustic wave through the crystal structure. A laser source emits a beam of light that is incident on the crystal surface. The propagated acoustic wave acts as a diffraction grating that diffracts the incident wave. Using an αBBO crystal allows for high resolution of light in the ultraviolet and visible spectra. The low speed of acoustic wave propagation through the crystal allows for more laser spots to be imaged than AODs made using other types of crystals.

26 Claims, 20 Drawing Sheets

(56) References Cited

OTHER PUBLICATIONS

PCT/EP2019/060658, International Preliminary Report on Patentability (Chap I) dated Oct. 27, 2019, 8 pages.
I. Martynyuk-Lototska,, et al, Elastic, Piezooptic and Acoustooptic Properties of Borate Crystals (BaB2O4, Li2B4O7 and CsLiB6O10), Integrated Ferroelectrics: An International Journal, 63:1, Dec. 2014, 99-103.
I. Martynyuk-Lototska,, et al, Acousto-optic interaction in alpha-BaB2O4, and Li2B4O7 crystals, Applied Optics, vol. 47, No. 19 , Jul. 1, 2008, pp. 3446-3454.
Jonathan B. Pfeiffer, et al, Acousto-optic figure of merit search, 2015 International Congress on Ultrasonics, 2015 ICU Metz, pp. 772-765.
I. Martynyuk-Lototska—Piezooptic properties of alpha-BaB2O4 amd LoNB4O7 Cyrstals,—2003 Ukr J Phys Opt V5, No. 1, 2003, pp. 19-26.
Jaeken et al, Solving the Christoffel equation: phase and group velocities , Comp Physic Comm, Nov. 22, 2016, pp. 1-17.
I. Martynyuk-Lototska, Highly efficient acoustooptic diffraction in alpha-BaB2O4 crystals: improving of geometry of acoustooptic interaction. Ukr. J. Phys. Opt. 2012, V13, No. 1, pp. 28-35.
Pfeiffer et al,—Measuring photoelastic constants—2015 Physics Procedia, 2015 International Congress on Ultrasonics, 2015 ICU Metz, pp. 766-769.
Pfeiffer et al, Measuring photoelastic coefficients with Schaefer Bergmann diffraction—Applied Optics, C26 vol. 57, No. 10 / Apr. 1, 2018, pp. C26-C35.
Pfeiffer et al, Complete elastic constants of alpha-BaB2O4: Schaefer-Bergmann acousto-optic diffraction and resonant ultrasound spectroscopy, J. Acoust. Soc. Am. 140 (4), Oct. 2016, pp. 2923-2932.
Pfeiffer—Exploring Novel Crystals and Designs for Acousto-Optic Devices, Univ of Colorado/Boulder, Electrial Engineering Graduate Theses & Dissertations, 2016, 109 pgs.

* cited by examiner

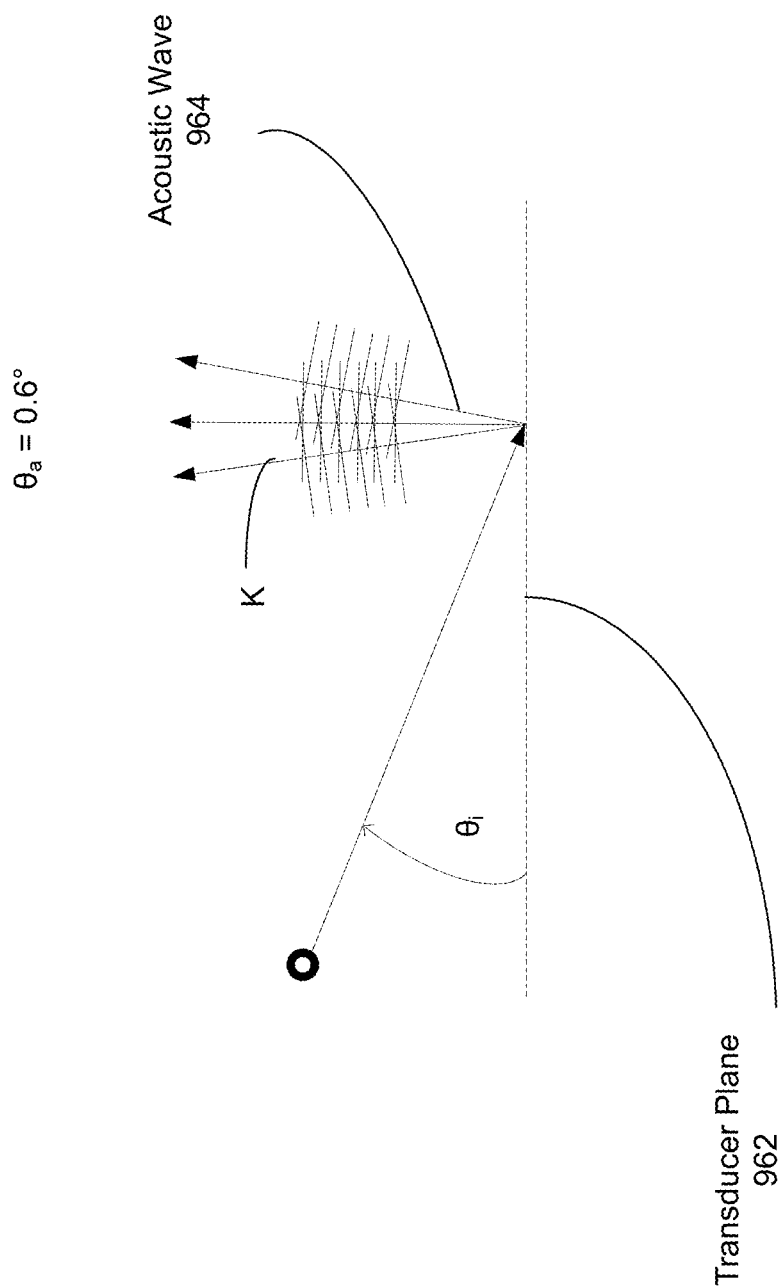

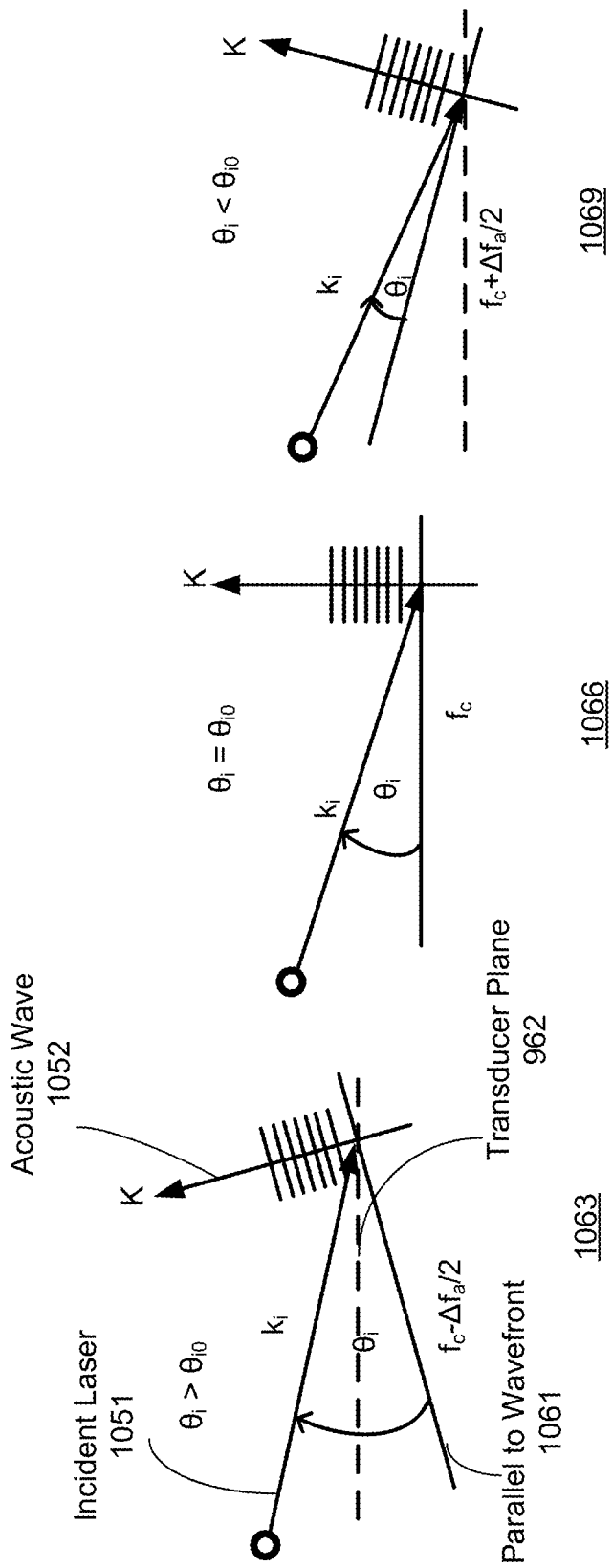

COMPACT ALPHA-BBO ACOUSTO-OPTIC DEFLECTOR WITH HIGH RESOLVING POWER FOR UV AND VISIBLE RADIATION

CROSS-REFERENCE

This application claims priority to and the benefit of U.S. Application No. 62/663,252 filed on 26 Apr. 2018, titled "COMPACT ALPHA-BBO ACOUSTO-OPTIC DEFLECTOR WITH HIGH RESOLVING POWER FOR UV AND VISIBLE RADIATION", which is incorporated by reference herein.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may also correspond to implementations of the claimed technology.

Acousto-optic deflectors (AODs) are used for laser beam scanning in optical lithography. However, currently-available AODs have limitations. Some AODs do not allow for high resolution of a deflected laser beam, or produce laser beam profiles that are too wide. Other AODs do not operate in the ultraviolet spectrum, and are not ideal for pattern generation. Compensation for AOD deficiencies, when possible, requires additional optical elements to be added in the optical path of the AOD, which increases system complexity and cost.

An opportunity arises to develop an AOD that is highly transparent to ultraviolet light and high-resolution. An AOD should reduce overall system cost, as less additional elements are needed to narrow beam profiles.

BRIEF DESCRIPTION OF THE DRAWINGS

FIG. 9 shows an acousto-optic interaction in an implementation of the AOD that uses a divergent acoustic wave.

FIG. 10 shows a simplified diagram illustrating how the incident angle $\theta_i$ of an incident laser from parallel to the wavefront of an acoustic wave changes as the frequency of the acoustic wave is varied.

DETAILED DESCRIPTION

Figure 1:
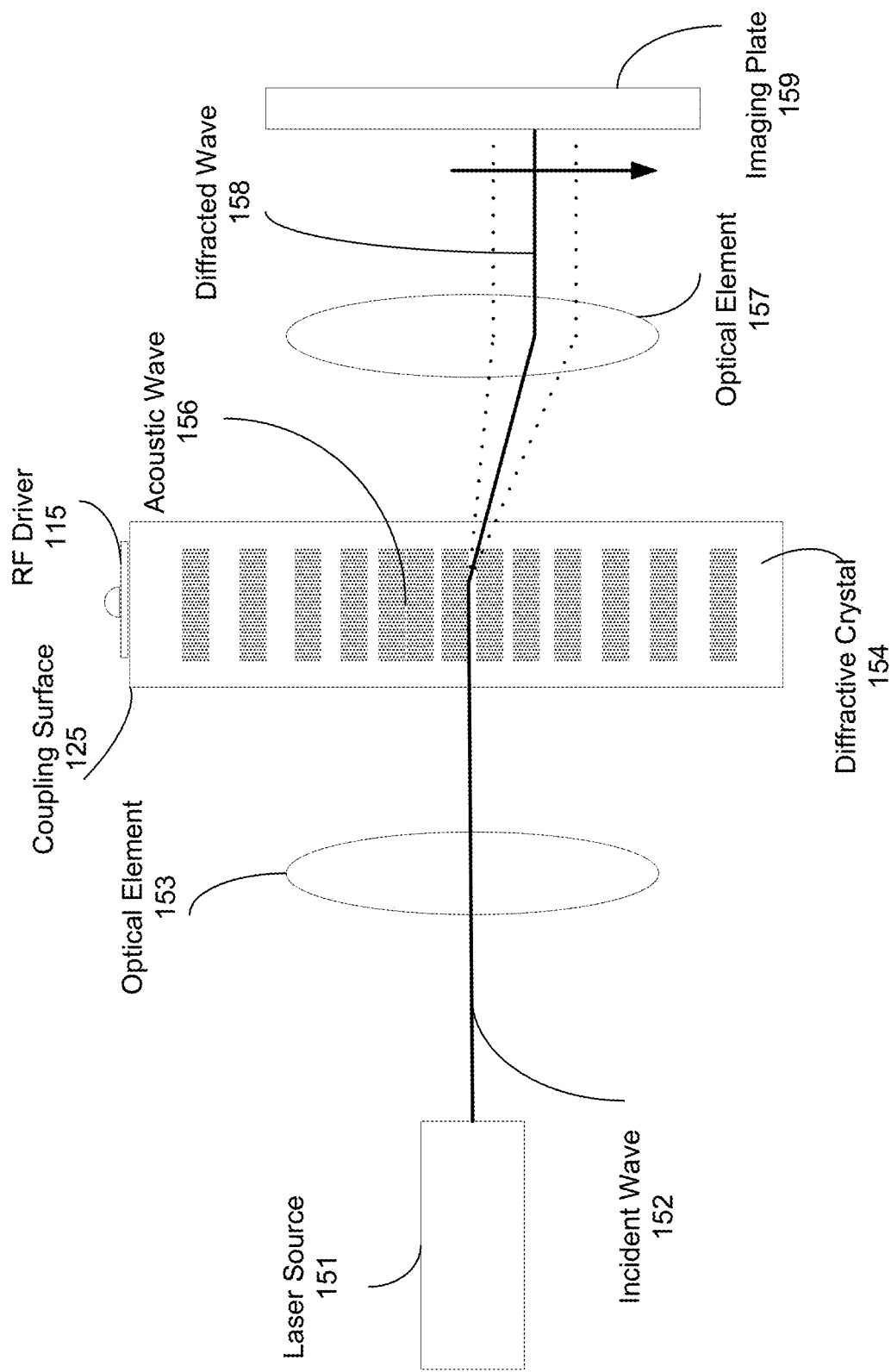
FIG. 1 illustrates an AOD system.

The following detailed description is made with reference to the figures. Example implementations are described to illustrate the technology disclosed, not to limit its scope, which is defined by the claims. Those of ordinary skill in the art will recognize a variety of equivalent variations on the description that follows.

At the heart of a microlithographic laser pattern generator is the acousto-optic deflector (AOD). A microlithographic laser writer uses a laser beam to pattern a latent image in a photosensitive surface, such as resist on a mask, which is used, in turn, to pattern wafers or large area displays. A modulator (not shown in FIG. 1) varies the strength of the laser beam to form the pattern. The AOD sweeps the laser beam across the photosensitive surface in stripes.

Applicant has developed an AOD design for its next series of pattern generators, to accommodate a shorter wavelength of patterning radiation. Shorter wavelength radiation, in a UV range, can produce narrower features with smaller critical dimensions. However, a new design is required because diffraction media that are transparent to previously used wavelengths are not equally transparent to the intended shorter wavelength. A new diffraction medium introduces new acousto-optic properties and requires innovation well beyond mere refinement of existing designs.

Applicant does not build AODs, but has been a frequent contributor to AOD design. Families of patents that include on AOD design features include:

U.S. Pat. No. 7,709,165, IMAGE ENHANCEMENT FOR MULTIPLE EXPOSURE BEAMS, inventor Peter Ekberg U.S. Pat. No. 8,144,307, IMAGE FORMING METHOD AND APPARATUS, inventor Torbjörn Sandström U.S. Pat. No. 8,891,157, ACOUSTO-OPTIC DEFLECTORS OVER ONE OCTAVE, inventor Torbjörn Sandström U.S. Pat. No. 8,896,909, METHOD AND DEVICE SCANNING A TWO-DIMENSIONAL BRUSH THROUGH AN ACOUSTO-OPTIC DEFLECTOR (AOD) HAVING AN EXTENDED FIELD IN A SCANNING DIRECTION, inventor Torbjörn Sandström U.S. Pat. No. 8,958,052, MULTI-METHOD AND DEVICE WITH AN ADVANCED ACOUSTO-OPTIC DEFLECTOR (AOD) AND A DENSE BRUSH OF FLYING SPOTS, inventor Torbjörn Sandström Invention of new AODs has been necessary as Applicant develops improved pattern generators. For the upcoming generation of machines, there was not any commercially available AOD design suitable for the next series of pattern generators.

Invention of the technology disclosed required development of new analytics for predicting interactions of diffraction coupling and acoustic transmission along various axes of diffraction media. Changing the wavelength of the laser beam required design of a new AOD. Different diffraction media are transmissive to different laser wavelengths. The acousto-optic properties of the crystal are among the unpredictable arts. Crystal properties include optical properties that can be described by ellipsoid, acoustic properties including transmission speed of wave fronts launched in various directions through the crystal, and acousto-optic properties that describe how an acoustic wave passing through the crystal locally changes the refractive index. A so-called walk-off angle reflects a diversion or walk-off of a sound wave's intensity profile from normal to the sound wave's direction of launch. The acoustic and acousto-optic properties are unpredictable and difficult to explore.

The inventor applied the newly developed analytics to a variety of crystal structures with high transparency in the UV, including the selected αBBO, βBBO, yttrium aluminum borate (YAB), lithium borate (LTB), yttrium aluminum garnet (YAG), potassium dihydrogen phosphate (KDP), calcium fluoride (CaF2), aluminum nitride (AlN), quartz, and sapphire. The new analytics permitted consideration of the entire sphere of possible orientations. The inventor combined analytics and experience with the practical requirements of pattern generators during invention.

Selection of a design was complicated by conflicting reports of acoustic properties of candidate diffraction media. For the selected αBBO, four candidate designs were invented, based on diffraction media property investigations by two researchers. The commercially available αBBO-based AOD design had much different properties that made it unsuitable for the next series of pattern generators. Fortunately, a small number of candidate designs were invented using the new analytics. Those designs are disclosed, along with sample data used to select the candidates.

The technology disclosed introduces for variations on a new AOD design based on an αBBO crystal (barium borate, alpha crystal form) with an optical coupling surface aligned to a transducer plane. The chosen transducer plane induces particularly slow transmission of an acoustic wave front through the crystal. Application of the AOD to a microlithographic pattern generation, unlike other applications, benefits from this particularly slow transmission. Slower transmission facilitates a slower sweep of the diffracted beam, which deposits more energy on a radiation-sensitive layer, such as resist on a large area mask for a TV. The technology disclosed secondarily describes an angle of incidence to the propagated wavefront at which the laser beam should be introduced into the crystal for proper refractive operation of the AOD. The technology disclosed produces much higher resolution patterning than prior attempts to build an AOD for a UV laser.

AOD System

FIG. 1 illustrates an AOD system. An incident light wave 152 from a laser source 151 is projected through the optical path of a diffractive crystal 154, illustrated in the figure as perpendicular. (Not shown is a modulator positioned between the laser and the AOD.) The AOD system may contain one or more optical elements 153 to direct the projected light towards the optical path of the crystal. The crystal includes a coupling surface 125. The AOD is driven by at least one transducer 155 and sometimes by multiple transducers affixed to the coupling surface. In one implementation, one or more transducers are designed to produce a slightly divergent acoustic wave. In another implementation, multiple transducers are designed to steer the wave by the phase relationships among the drivers. The transducer 155 induces an acoustic wave 156 in the AOD at a very high frequency, above 100 megahertz for the technology disclosed. The acoustic wave propagates at the speed of sound through the AOD crystal 154. We disclose using a slow direction of propagation through the αBBO crystal, contrary to prior designs that propagated sound through crystal at a speed of sound twice as great, or more, as the disclosed direction of propagation through the selected αBBO crystal. The acoustic wave is driven at a varying frequency as it passes through the AOD crystal. In addition, the intensity of the acoustic wave attenuates across this width. The diffraction properties of the crystal depend on the local frequency of the acoustic wave. Multiple laser beams can be simultaneously projected through the crystal, taking into account local diffractive properties.

The diffracted ray is then directed to a radiation sensitive layer in an imaging plane 159 in order for the laser spot to generate a pattern. Optical elements 157 may be placed in the optical path of the diffracted ray in order to direct the diffracted ray to the imaging plane 159. The frequency of the acoustic wave is ramped to change the angle at which the AOD diffracts the beam and sweep the beam. This scan produces an arrangement of laser spots that is visible on the imaging plane 159.

Crystal Properties

Figure 2B:
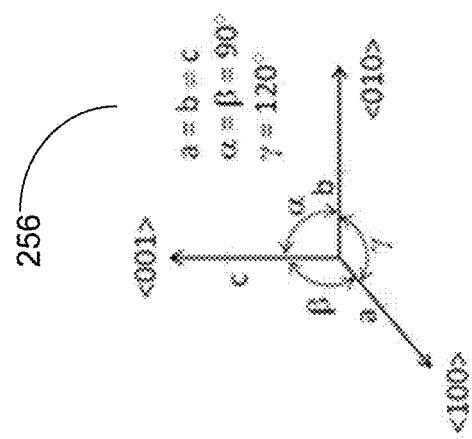
FIGS. 2A and 2B show properties of the α-BBO crystal used in the AOD system.
Figure 2A:
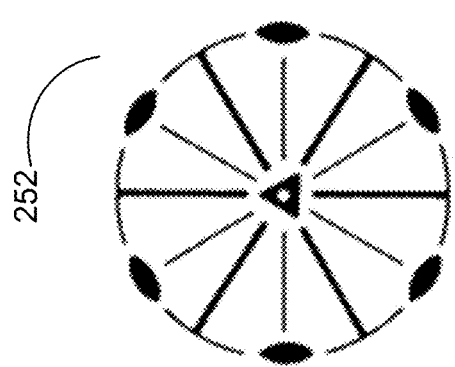

FIGS. 2A and 2B show properties of the α-BBO crystal used in the AOD system. The α-BBO is a crystal that belongs to the trigonal crystal system. FIG. 2A shows a stereograph 252 of the crystal and a unit cell 256 for the trigonal crystal.

The stereograph 252 shows a crystalline structure with one three-fold rotation axis (its main axis of symmetry), three two-fold rotation axes perpendicular to the three-fold rotation axis, and three vertical mirror planes passing between the two-fold axes.

The unit cell 256 shows a mapping of the rotation axes of the crystal to a Cartesian system. In the trigonal crystal system, the three-fold rotation axis (parallel to the c-side of the unit-cell along the <001> direction) is aligned with the Cartesian z-axis. The three-fold rotation axis is the optic axis of the crystal. One of the two-fold rotation axes (parallel to the a-side of the unit cell along the <100> direction) is aligned with the Cartesian x-axis. The y-axis is orthogonal to x and z, forming a right-handed Cartesian system.

Figure 2C:
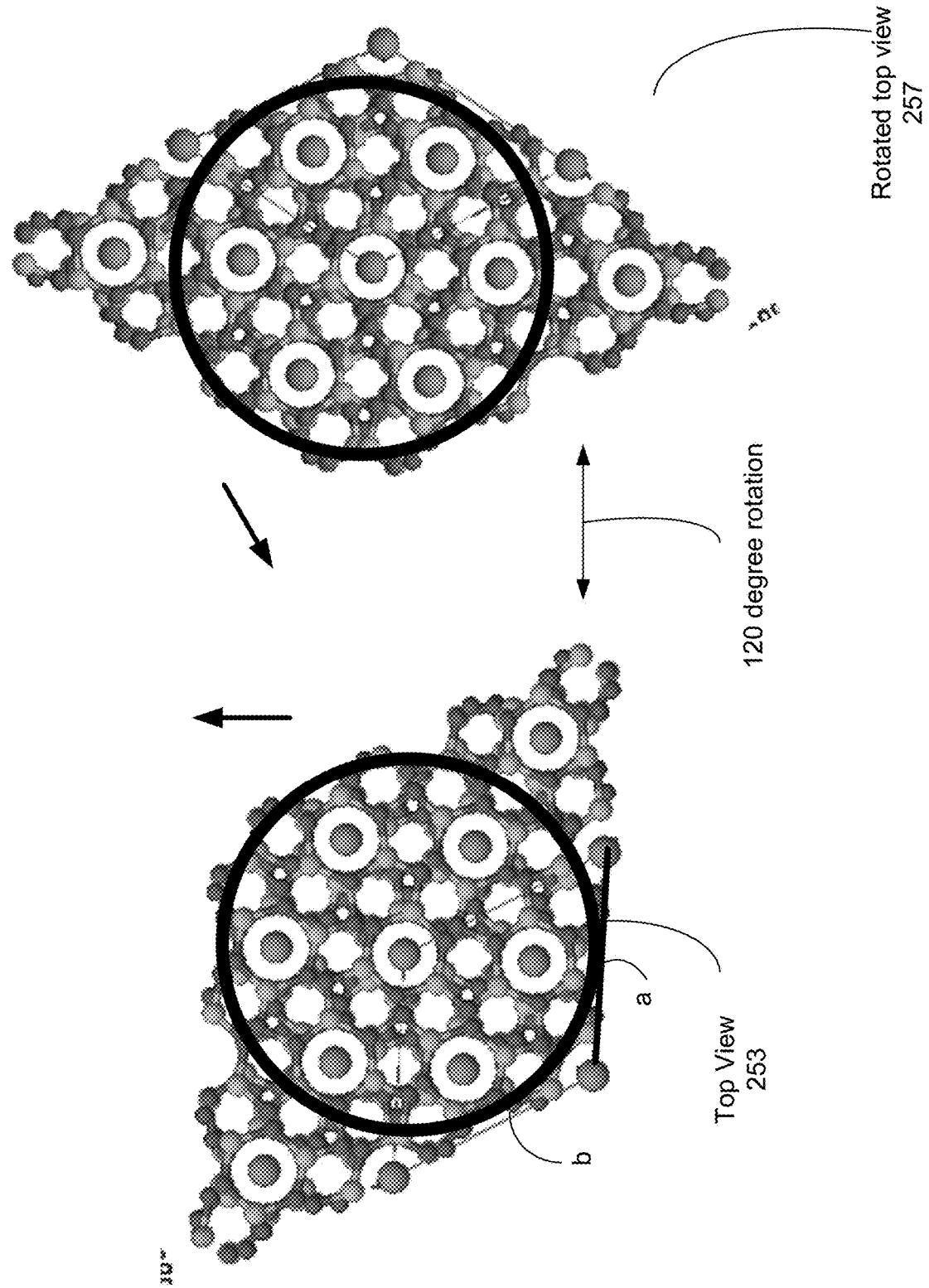
FIG. 2C shows the rotational symmetry of the crystal.

FIG. 2C shows the rotational symmetry of the crystal. The crystal has three-fold symmetry around the optic axis, which means that the crystal structure is identical when rotated 120 degrees around the c-axis. Comparing the circumscribed sections of the top view 253 and the rotated top view 257 shows circumscribed portions of the crystal structures are identical. The a-axis of the crystal is aligned with an edge of the crystal unit cell connecting two barium atoms.

Figure 2D:
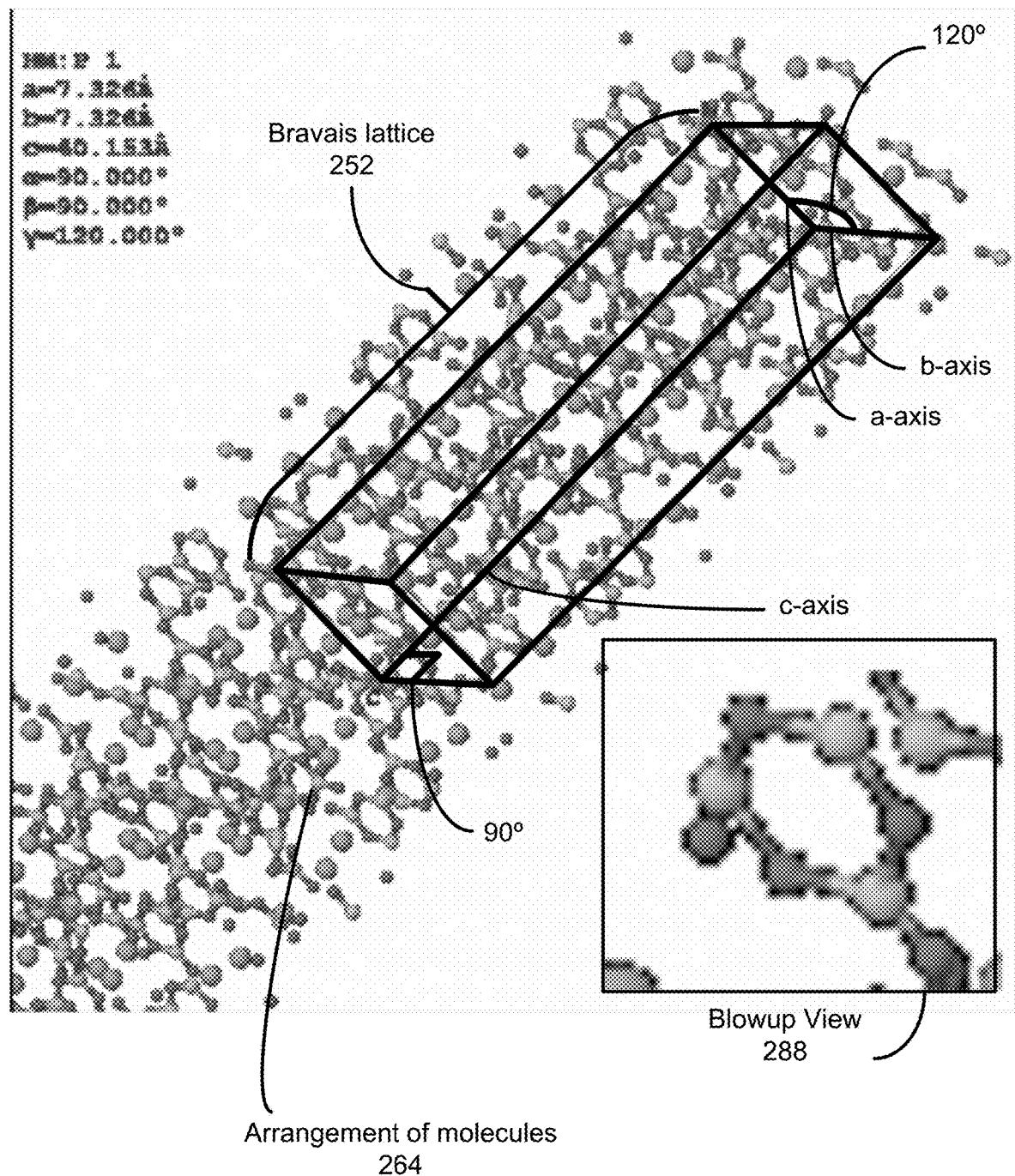
FIG. 2D illustrates a crystal structure of αBBO and its optical axis.

FIG. 2D illustrates a crystal structure of αBBO and its optical axis. FIG. 2D shows an arrangement of stacked αBBO molecules 264 as well as a blow-up image of an αBBO molecule 288. The three-fold symmetry of the crystal follows from the structure of the BBO hexagonal ring 288.

Figure 3B:
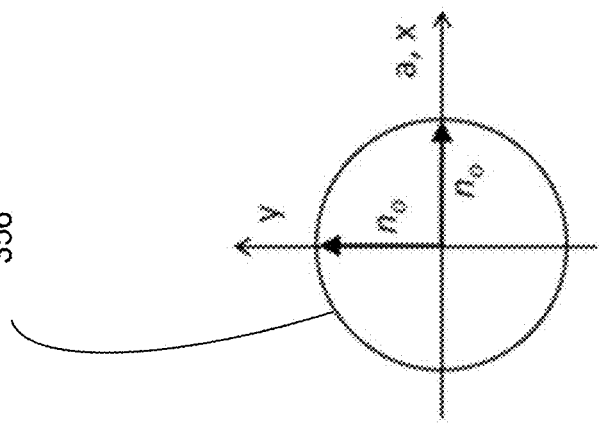
FIGS. 3A and 3B show cross-sections of the index ellipsoid, or indicatrix, of the α-BBO crystal.
Figure 3A:
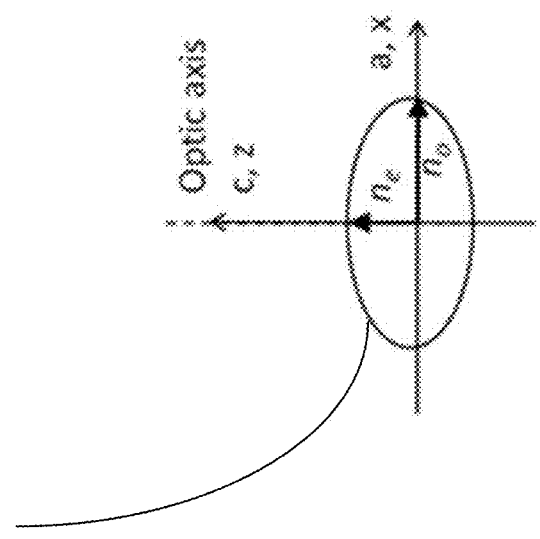

FIGS. 3A and 3B show cross-sections of the index ellipsoid, or indicatrix, of the α-BBO crystal. FIG. 3A shows an elliptical cross section 352 and FIG. 3B shows a circular cross section 356. The radii of the elliptical cross section 352 correspond to the refractive indices of a linearly polarized planar light-wave propagating in crystal for a specific polarization direction. To determine the refractive index experienced by a wave with specific propagation and polarization directions, the polarization vector of the wave is decomposed along the two semi-axes of the elliptical cross-section 352 of the indicatrix that is perpendicular to the k-vector of the wave. Whatever the direction of the k-vector, one component of the polarization vector will always lie on the circle of radius $n_o$ perpendicular to the z-axis, and light polarized in this direction will experience the ordinary refractive index $n_o$. This is shown by the circular cross section 356 of the indicatrix. The other polarization component will be orthogonal to this and to the direction of the k-vector, and light polarized in this direction will experience a refractive index $n(\theta)$ that depends on an angle $\theta$ between the k-vector and the z-axis, and on the values of $n_e$ and $n_o$. For α-BBO, $n_e$ and $n_o$ can be expressed as functions of the wavelength $\lambda$ (in units of μm).

$$n_e = \sqrt{2.31197 + \frac{0.01184}{\lambda^2 - 0.01607} - 0.004\lambda^2}$$

$$n_o = \sqrt{2.67579 + \frac{0.02099}{\lambda^2 - 0.0047} - 0.00528\lambda^2}$$

Properties of the α-BBO crystal relating to wave propagation are characterized by the crystal's elastic and photoelastic coefficients, which are difficult to measure. Elastic constants impact the velocity, diffraction, and polarization of acoustic waves in media. They can be used to predict the diffraction efficiency of the material as well as the velocity and walk-off (deviation of the wave's direction of propagation from the wave front normal vector) of the acoustic wave. The elastic coefficients can be used to design an angle for the acoustic coupling surface at which transducer(s) produces acoustic waves within a specific range of velocities. Photoelastic coefficients describe changes in optical properties of materials in response to mechanical stresses, such as changes in the refractive index of a crystal. An acoustic wave propagating through a crystal creates sinusoidally varying strain, which produces a diffraction grating in the crystal.

α-BBO has the following strain-optic tensor:

$$P = \begin{bmatrix} p_{11} & p_{12} & p_{13} & p_{14} & 0 & 0 \\ p_{12} & p_{11} & p_{13} & -p_{14} & 0 & 0 \\ p_{31} & p_{31} & p_{33} & 0 & 0 & 0 \\ p_{41} & -p_{14} & 0 & p_{44} & 0 & 0 \\ 0 & 0 & 0 & 0 & p_{44} & p_{41} \\ 0 & 0 & 0 & 0 & p_{14} & (p_{11}-p_{12})/2 \end{bmatrix}$$

Two significantly different sets of elastic constants and photoelastic coefficients were measured by Pfeiffer and Martynyuk.

Pfeiffer's elastic constants appear in Pfeiffer, J. B., Wagner, K. H., Kaufman, Y., Ledbetter, H., Soos, J., & Diestler, M. (2016). Complete elastic constants of α-BaB2O4: Schaefer-Bergmann acousto-optic diffraction and resonant ultrasound spectroscopy. *The Journal of the Acoustical Society of America*, 140(4), 2923-2932, accessible May 17, 2018 at asa.scitation.org/doi/abs/10.1121/1.4964823. Pfeiffer's photoelastic coefficients appear in Pfeiffer, J. B., & Wagner, K. H. (2018). Measuring photoelastic coefficients with Schaefer-Bergmann diffraction. *Applied Optics*, 57(10), C26-C35, accessible May 17, 2018 at osapublishing.org/ao/abstract.cfm?uri=ao-57-10-C26. Pfeiffer used more than one method of measuring coefficients. In the tables below, the measurement method selected for reporting is the SBD method.

Martynyuk's elastic constants and photoelastic coefficients appear in Martynyuk-Lototska, I., Mys, O., Dudok, T., Adamiv, V., Smirnov, Y., & Vlokh, R. (2008). Acousto-optic interaction in α-BaB2O4 and Li2B4O7 crystals. *Applied Optics*, 47(19), 3446-3454, accessible May 17, 2018 at osapublishing.org/ao/abstract.cfm?uri=ao-47-19-3446. Additional publications by these authors could have been used, but were not.

Because some of the coefficients calculated by Pfeiffer and Martynyuk differ, predicted wave interactions and resulting also differ depending on the set of coefficients used. Two measurements of elastic constants and photoelastic coefficients are displayed in the table below. By convention, elastic and photoelastic properties are expressed as 6×6 tensor matrices with coefficients corresponding to different directions of propagation within the crystal. The elastic and photoelastic coefficients listed are non-zero elements of each tensor matrix.

The following table is drawn from a pair of publications by Pfeiffer and from a publication by Martynyuk. The elastic constants that these researchers used to calculate the speed of sound propagating along different orientations of the crystal were:

| Elastic constant | Martynyuk (2008) (×10⁹ N/m²) | Pfeiffer (2016) - SBD (×10⁹ N/m²) |
|---|---|---|
| $C_{11}$ | 117 ± 4 | 117 ± 3 |
| $C_{12}$ | 52 ± 2 | 54 ± 2 |
| $C_{13}$ | 57 ± 11 | 25 ± 2 |
| $C_{14}$ | −5.5 ± 1.3 | −5.0 ± 0.3 |
| $C_{33}$ | 39 ± 1 | 39.3 ± 1.6 |
| $C_{44}$ | 5.6 ± 0.2 | 6.33 ± 0.8 |
| $C_{66}$ | 33 ± 2 | 33 ± 2 |

The table of elastic coefficients shows that the most significant difference in the elastic constant values is the matrix element $C_{13}$. When using Martynyuk's elastic constants in calculations, the calculated minimum speed of sound through the crystal at one particular orientation is close to 940 m/s, while using Pfeiffer's coefficients the minimum speed at another particular orientation is around 1200 m/s.

The photoelastic coefficients that describe changes in optical properties of materials were:

| Photoelastic coefficient | Martynyuk (2008) | Pfeiffer (2018) - SBD |
|---|---|---|
| $p_{11}$ | 0.13 ± 0.9 | 0.12 ± 0.2 |
| $p_{12}$ | 0.2 ± 0.1 | 0.23 ± 0.3 |
| $p_{13}$ | 0.13 ± 0.2 | 0.22 ± 0.2 |
| $p_{14}$ | −0.8 ± 0.2 | −0.007 ± 0.003 |
| $p_{31}$ | −0.15 ± 0.15 | (±)0.20 ± 0.2 (sign uncertainty) |
| $p_{33}$ | −0.11 ± 0.9 | (±)0.23 ± 0.2 (sign uncertainty) |
| $p_{41}$ | 0.5 (+0.24/−0.14) | −1 ± 1.3 |

In the list of coefficients presented by Pfeiffer we have an uncertainty in the sign of $p_{31}$ and $p_{33}$. However, both of these coefficients have the same sign.

Similar information regarding these constants and coefficients was earlier given in Pfeiffer, J. B., & Wagner, K. H. (2015). Measuring photoelastic constants with Schaefer-Bergmann diffraction. *Physics Procedia*, 70, 766-769, accessible May 17, 2018, at sciencedirect.com/science/article/pii/S1875389215008718. However, the coefficient list in Pfeiffer (2015) was not complete and presented some differences from Pfeiffer 2018, such as missing $p_{44}$ and $p_{41}$, and $p_{14}\sim0$.

Geometry of the α-BBO Deflector

The α-BBO deflector designs disclosed are specially adapted to microlithography using a UV laser source producing high resolution patterns on a UV sensitive layer. The technology disclosed selects a direction of propagation through the α-BBO crystal that has a low speed of sound and high figure of merit $M_2$ and produces a large number of spots for a given beam size. In order to create a design with the desired characteristics, the geometries of deflector designs are derived using the elastic constants and photoelastic coefficients published by Pfeiffer and by Martynyuk. The two sets of coefficients (and constants) lead to different results and consequently different optimal geometries for the deflector. Four geometries were determined: geometries 1 and 2 were designed using Pfeiffer's data, while geometries 3 and 4 were designed using Martynyuk's data. Other geometries are also possible; as for example geometries that are the specular reflection about the x-y plane (due to crystal symmetry). Two of the four configurations that have been analyzed (specifically number 2 and 4) are close in terms of angles used.

The four geometries were selected to produce a slow speed of sound through the crystal, a high-intensity diffracted output beam, and a wide frequency bandwidth. The inventor selected the launch angle of the acoustic wave and the angle of incidence of the laser beam that would produce these characteristics. As will be described in the discussion of FIGS. 4 and 5, a range of crystal directions producing low speeds of sound for propagating acoustic waves were found by numerically solving the Christoffel equation for both sets of coefficients. As will be described in the discussion of FIGS. 9, 10, and 11, specific angles within this range were chosen for the geometries by testing whether the incident laser k-vector, acoustic wave K-vector, and diffracted wave k-vector satisfied a Bragg matching condition. Satisfying the Bragg matching condition yielded incidence angles that produce a high intensity diffracted light beam over a wide bandwidth. Choices of angles that yielded too high of a speed of sound or too small of a figure of merit $M_2$ were discarded. Further discussion of the figure of merit is written in the description of FIG. 16.

Figure 4:
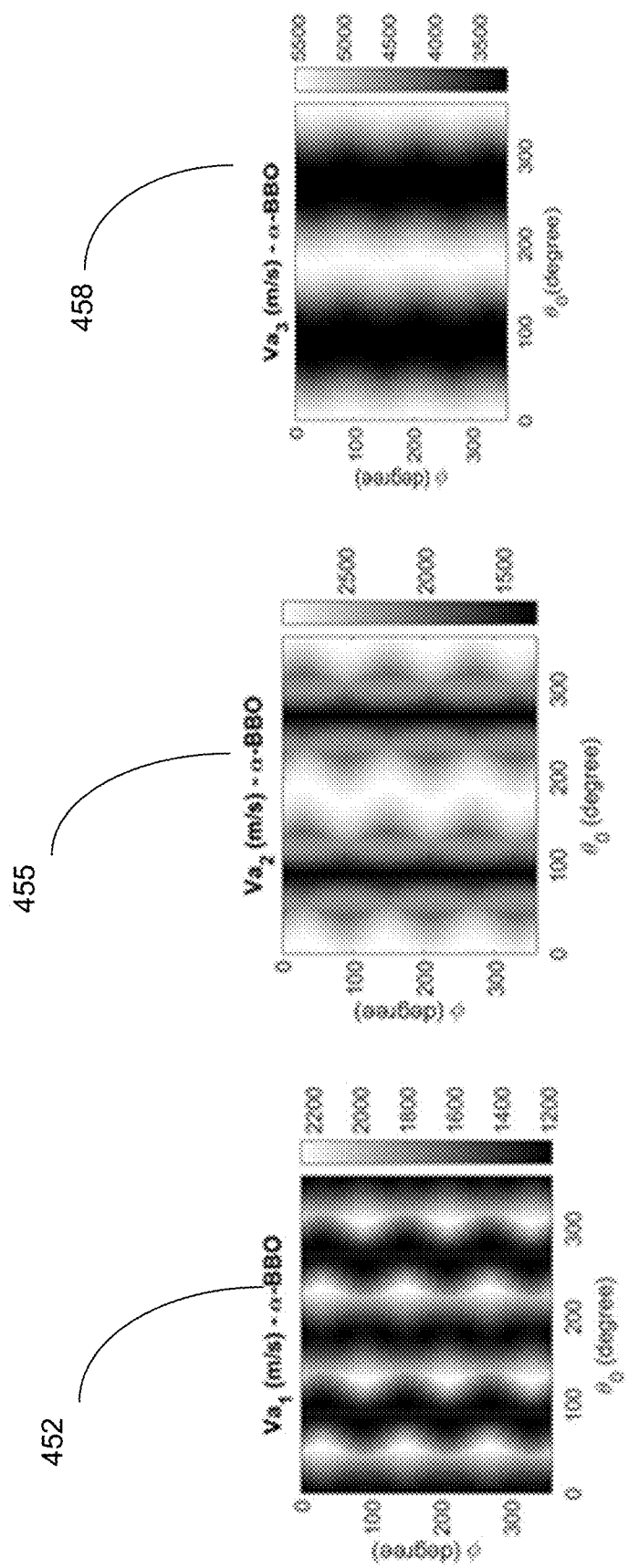
FIGS. 4 and 5 show the speeds of sound calculated by the inventor for the shear and longitudinal waves as a function of the direction of propagation of the acoustic wave.
Figure 5:
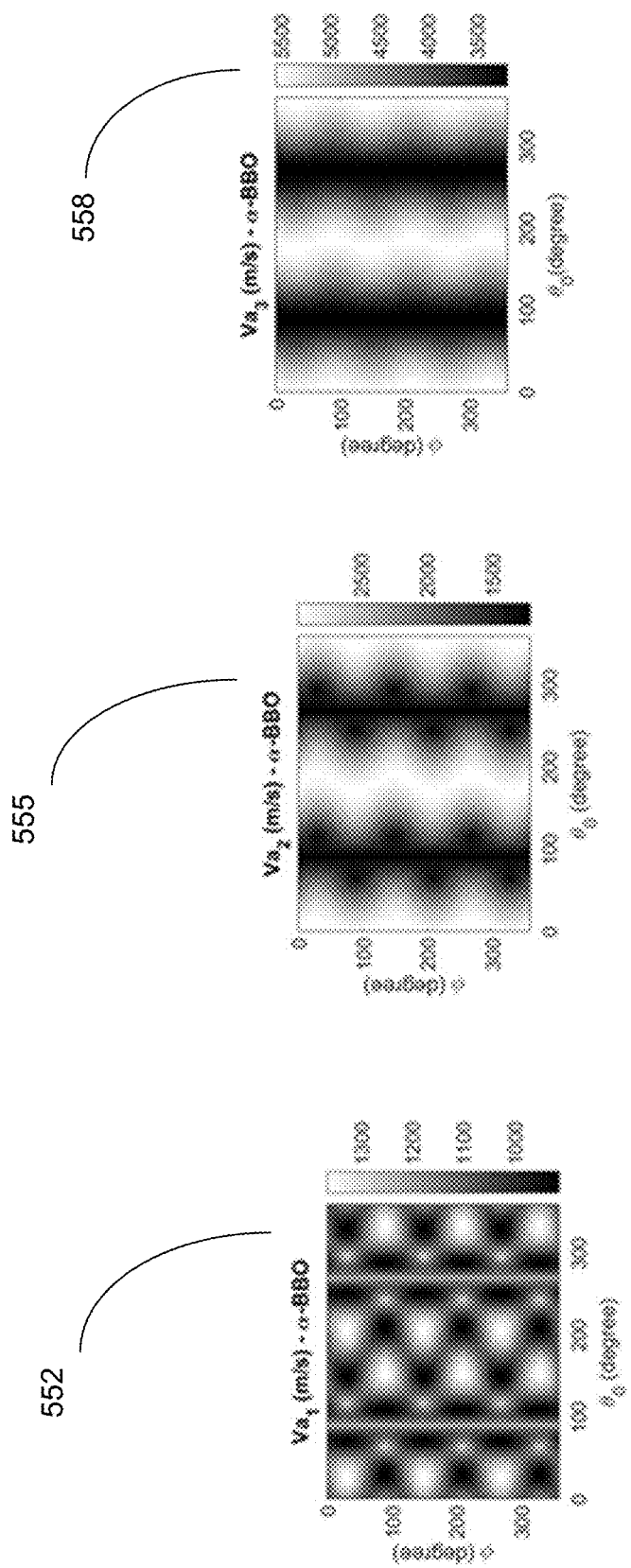

FIGS. 4 and 5 show the speeds of sound calculated by the inventor for the shear and longitudinal waves as a function of the direction of propagation of the acoustic wave. The inventor calculated the speeds of sound by numerically solving the Christoffel equation for Pfeiffer's data (FIG. 4) and Martynyuk's data (FIG. 5). For Pfeiffer's data, images 452, 455, and 458 show speeds of sound $V_{a1}$, $V_{a2}$, and $V_{a3}$ for three acoustic eigenmodes. Images 452 and 455 show information for shear modes, while 458 shows information for a longitudinal mode For Martynyuk's data, images 552, 555, and 558 show speeds of sound $V_{a1}$, $V_{a2}$, and $V_{a3}$ for three acoustic modes. Images 552 and 555 show information for shear modes while 558 shows information for a longitudinal mode. Angles $\phi$ and $\theta_0$ were used to determine directional components $l_x$, $l_y$, and $l_z$ of the acoustic wave vector K using the equations $l_x = \cos\theta_0 \cos\varphi$ $l_y = \cos\theta_0 \sin\varphi$ $l_z = \sin\theta_0$ These directional components were used to create the matrix $$l_{iK} = \begin{pmatrix} l_x & 0 & 0 & 0 & l_z & l_y \\ 0 & l_y & 0 & l_z & 0 & l_x \\ 0 & 0 & l_z & l_y & l_x & 0 \end{pmatrix}$$

that was used in the Christoffel equation to solve for the velocity V of the acoustic wave $[\Gamma_{ij} - \rho V^2 \delta_{ij}] v_j = 0$ where:

$\Gamma_{ij} = l_{iK} c_{KL} l_{Lj}$ and where:

$l_{Lj} = [l_{iK}]^T$ $C_{KL}$ is the set of elastic constants measured by either Pfeiffer or Martynyuk, ρ is the density of the crystal, $\delta_{ij}$ is the Kroenecker delta, and $v_j$ is a vector of acoustic wave vibration velocities. The vector $v_j$ was used to determine whether the acoustic wave is shear or longitudinal. The Christoffel equation was calculated using steps of both $\phi$ and $\theta_0$ from zero to 360 degrees.

The inventor's numerical solution to the Christoffel equation yields slow speeds of sound $V_{a1}$ in both FIGS. 4 and 5. Overlapping the $V_{a1}$ graphs from both sets of data shows regions of the angular space where both the Pfeiffer and Martynyuk data lead to slow speeds of sound.

Figure 6:
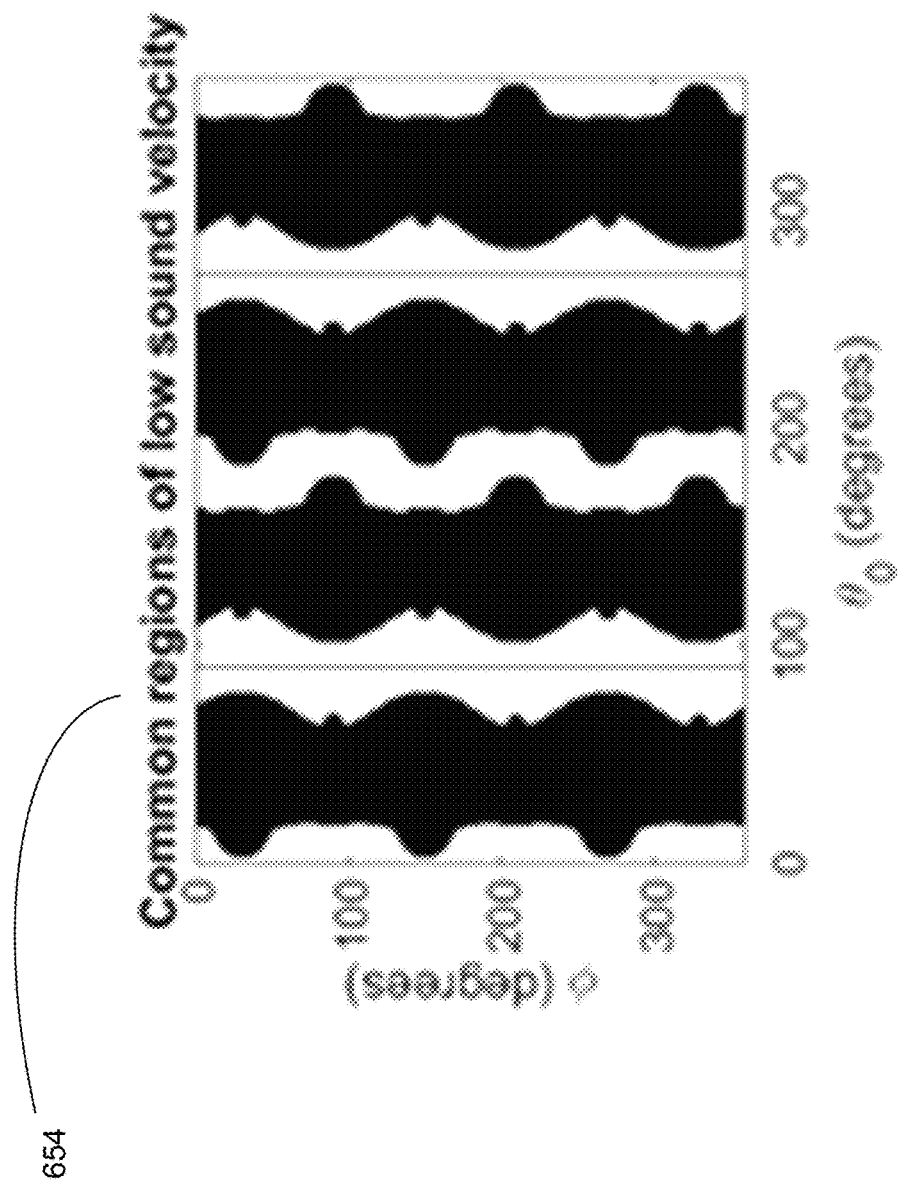
FIG. 6 shows an overlap of two graphs of calculated speeds of sound.

FIG. 6 shows an overlap 654 of the graphs in FIGS. 4 and 5, indicating in white regions common to Pfeiffer and Martynyuk as having the slowest shear wave velocity. This velocity is <1400 m/s in case of Pfeiffer and <1200 m/s in case of Martynyuk. In this figure, the angles that produce a slow speed of sound are indicated in white regions, as opposed to FIGS. 4 and 5, which indicate the slow speed regions in black. The deflector is designed using these angles to obtain a low speed of sound.

Figure 7B:
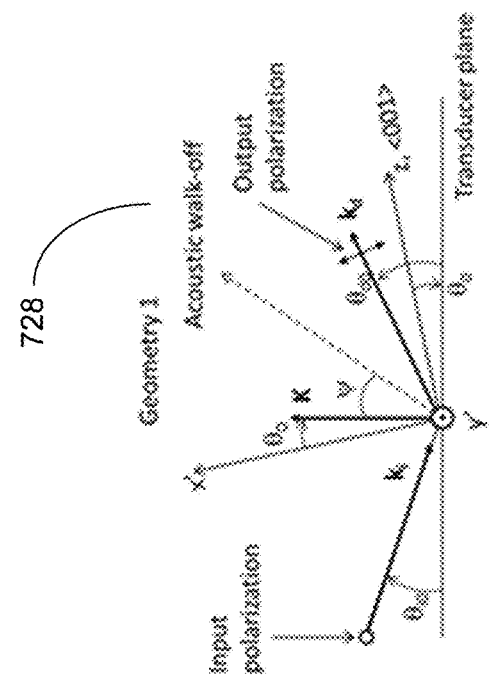
FIGS. 7A, 7B, 7C and 7D show the interaction geometries of the light and acoustic waves on the plane x'z.
Figure 7D:
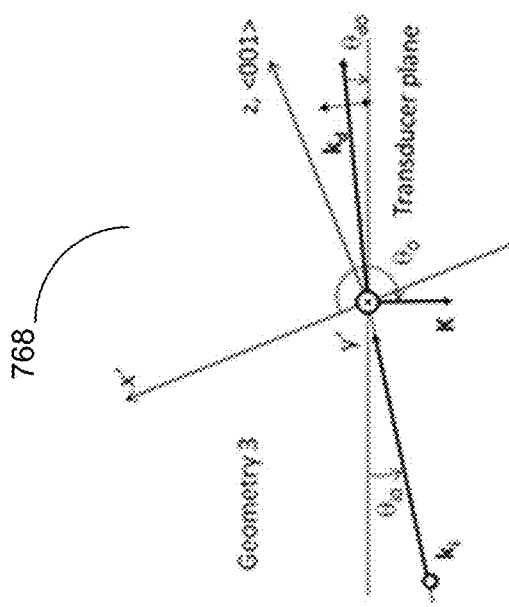
Figure 7A:
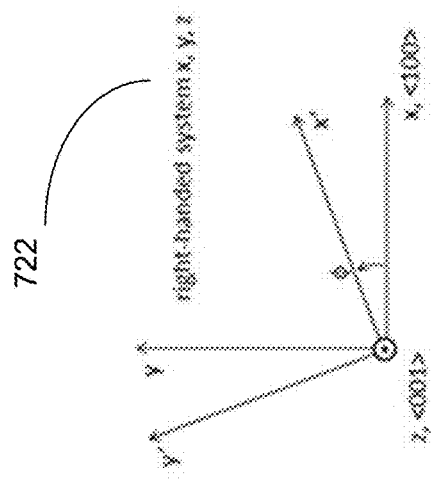

FIG. 7A shows a rotation 722 of the x y z coordinate system by the angle f about the z axis. The rotated coordinate system is the x' y' z system FIGS. 7(B-D) show the interaction geometries 728, 762, and 768 of the light and acoustic waves on the plane x'z. The geometries are defined in terms of the K-vector of the acoustic wave and the angles $\phi$ and $\theta_0$. An interaction plane x'-z is defined between the optical and acoustic waves, where the x'-axis lies on the x,y plane and makes an angle $\phi$ with the x-axis as shown in FIG. 3(a). In each marked angle, the arrow next to the angle name points in a direction signifying a positive angle. The angle $\phi$ and the polarization of the acoustic wave are chosen to have a particularly low $V_a$. Potential operating conditions combine the acoustic frequency range and acoustic wave angular span. The frequency range approaches an octave. The acoustic wave can be slightly divergent or its direction can be tuned by beam-steering techniques.

Figure 7C:
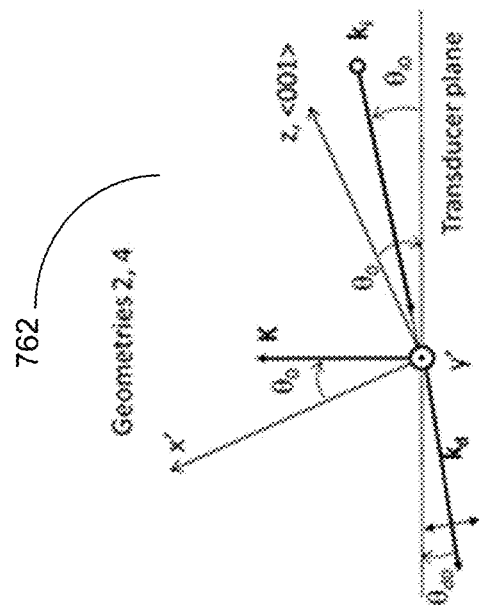

The angle between the z-axis (or <001> direction) and the transducer plane is indicated by $\theta_0$. The angle $\theta_0$ is the angle between the launch-direction of the acoustic wave and the x'-axis (as indicated in FIGS. 7B-D). The K-vector K of a divergent acoustic wave (at the central acoustic frequency $f_c$) is oriented at 90 degrees with respect to the transducer plane. If the acoustic wave is divergent, then the divergence cone is centered at about 90 degrees with respect to the transducer plane. If the acoustic wave is not divergent, beam steering is required to perform a full scan. The divergence of the acoustic-wave (or the steering angle required for full scan in case of a non-diverging acoustic wave) is indicated in the following with $\Delta\theta_a$.

The K-vector of the incident optical wave $k_i$ forms a fixed angle $\theta_{i0}$ with the transducer plane. While the K-vector of the diffracted optical wave $k_d$ (at the central acoustic frequency $f_c$) forms an angle $\theta_{d0}$ with the transducer plane. Note that in FIG. 3a-c the angles are indicated by arrow-signs that point in the positive angular direction according to the adopted convention.

The parameters for the four geometries are given in the following table:

|  | Geometry1 (Pfeiffer) | Geometry 2 (Pfeiffer) | Geometry 3 (Martynyuk) | Geometry 4 (Martynyuk) |
|---|---|---|---|---|
| φ (degrees) (azimuthal angle of acoustic wave launch or angle between x' and x) | 64.5 ± 2.5 | 63.5 ± 1 | 80 ± 1 | 70 ± 1 |
| $\theta_0$ (degrees) (altitude angle of acoustic wave launch or angle between transducer plane and optic axis) | 7.7 ± 0.2 | 10 ± 0.2 | 205 ± 0.2 | 10 ± 0.2 |
| $\theta_{i0}$ (degrees) (incident laser beam relative to transducer plane) | 3.3 ± 0.2 | 3.9 ± 0.2 | 9.7 ± 0.2 | 4.2 ± 0.2 |
| $\theta_{d0}$ (degrees) (diffracted laser beam relative to transducer plane) | 0 ± 0.2 | −0.8 ± 0.2 | −5.5 ± 0.2 | −0.4 ± 0.2 |
| $\Delta\theta_a$ (degrees) (divergence of acoustic wave) | ±0.6 | ±0.25 | ±1 | ±0.35 |
| $V_a$ (m/s) | 1220 ± 7 | 1255 ± 10 | 944 ± 3 | 1049 ± 2 |
| $\theta_i$ @$f_1$(@$f_2$) (degrees) | 4.3 ± 0.2 (3.1 ± 0.2) | 3.9 ± 0.2 (4.4 ± 0.2) | 11.3 ± 0.2 (9.3 ± 0.2) | 3.8 ± 0.2 (4.7 ± 0.2) |
| $\theta_d$ @$f_1$(@$f_2$) (degrees) | −2.1 ± 0.2 (1.2 ± 0.2) | −1.8 ± 0.2 (−0.1 ± 0.2) | −8.5 ± 0.2 (−3.7 ± 0.2) | −1.3 ± 0.2 (0.35 ± 0.2) |
| $\Delta\theta_{scan}$ (degrees) | 2.2 ± 0.2 | 2.2 ± 0.2 | 2.8 ± 0.2 | 2.5 ± 0.2 |
| $M_2$ (s$^3$/kg) | ~2 × 10$^{-14}$ | ~2 × 10$^{-14}$ | ~2 × 10$^{-13}$ | ~4 × 10$^{-14}$ |
| $f_c$ (MHz) | 450 | | | |
| $\Delta f_a$ (MHz) | 300 | | | |
| Incident optical beam polarization | ordinary | | | |
| Diffracted optical beam polarization | extraordinary | | | |
| Acoustic wave polarization | Quasi shear with displacement along the direction perpendicular to the interaction plane | | | |

In the above table, the designations of the angles φ as the azimuthal angle and $\theta_0$ as the altitude angle is derived from the ISO conventions for these angles commonly used in physics. The relevant ISO standard appears in International Organization for Standardization. (2009). *Quantities and units—Part 2: Mathematical signs and symbols to be used in the natural sciences and technology* (ISO 80000-2:2009). Accessible Jun. 26, 2018, from https://www.iso.org/standard/31887.html.

For angles φ, rotated about the optic axis, the angles given are trigonal periodic, due to the hexagonal structure of the boron and oxygen atoms in the crystal. That is, 64.5 degrees means 64.5 or 184.5 or 304.5 degrees. Similarly, 80 degrees means 80 or 200 or 320 degrees. This three-fold crystal symmetry can be expressed as a rotation of 80 degrees, or trigonal by 120 degrees. Alternatively, a rotation of 80 degrees, or ±120 degrees from that rotation. The inventor's analysis reveals that many angles φ, rotated about the optic axis, give similar speeds of sound.

For $\theta_0$, the altitude angle of the acoustic wave launch, directions with slow speed of sound are not three-fold symmetric, because the angle is not planar with the hexagonal structure of the boron and oxygen atoms. Instead, the speed of sound is two-fold periodically affected. The relationship of $\theta_0$ to refractive indices and the photoelastic coefficients is more complex.

The design criteria given in the table above for angles φ and $\theta_0$ should be considered manufacturing tolerances, rather than design tolerances. A design with angle φ that encompasses the whole range for a data source±3, 4 or 5 degrees should be considered within the teaching of this disclosure. That is 63.5 to 64.5 degrees±3, 4 or 5 degrees or 70 to 80 degrees±3, 4 or 5 degrees for the angle φ should be considered reasonably within the teaching of this disclosure. Similar, design with angle $\theta_0$ that encompasses the whole range of Pfeiffer's values or either of Martynyuk's values±1, 1.5 or 2 degrees should be considered within the teaching of this disclosure. That is 7.7 to 10.0 degrees±1, 1.5 or 2 degrees or 205 degrees±1, 1.5 or 2 degrees or 10 degrees±1, 1.5 or 2 degrees for the angle $\theta_0$ should be considered reasonably within the teaching of this disclosure. These somewhat broader ranges protect the inventor's work for attempts to exploit our teachings with slightly degraded performance that is still superior to prior designs.

Designing the deflector to make use of a 5 mm diameter optical-beam (for example) allows one to obtain a number of resolved spots greater than 530 at 266 nm. The size of the beam is made larger to increase the number of resolved spots.

In a single transducer device, according to the design parameters shown in Table 1, the acoustic power will be spread over an angle of 0.5-2 degrees and only a small portion of the acoustic power will be used at a specific angle. In other implementations, multiple transducers may be used to increase the efficiency. This makes it possible to increase the transducer length which reduces the acoustic angular spread increasing the efficiency of the interaction. It will also be possible to achieve the same angle of diffraction by steering the direction of the acoustic beam.

FIGS. 7(B-D) show four of the possible device configurations that allow for the lowest speed of sound propagation and high acousto-optic interaction efficiency. As can be seen from FIG. 6 there are multiple directions where the speed of sound is slowest. Because of crystal symmetry, the acousto-optic interactions with the lowest speeds of sound and high efficiencies can be obtained by rotating the angle φ by multiples of 120 degrees, or the angle θ₀ by 180 degrees.

FIGS. 8(A-C) show the four different geometries of FIGS. 7(b-d) in x', y', z Cartesian space in K-surface representation. The K-surface representation describes conditions under which the AOD produces a high-intensity diffracted beam. In the selected geometries, the angles of the incident beam, diffracted beam, and acoustic wave K-vectors satisfy Bragg matching conditions. In the K-surface representation, a circle (dotted line) represents the K-vector, or spatial frequency, of an ordinary optical wave that propagates in the material. The ordinary wave always experiences the refractive index $n_o$ and the size of its K-vector is constant. The constant size of its K-vector defines a spherical surface, which is shown here as a circular cross section 834. The solid ellipse is a K-surface 832 of an extraordinary wave. The refractive index experienced by this wave will be equal to $n_o$ only along the $K_z$ direction. In other directions, the refractive index the wave experiences is dependent on its angle from the $K_z$ axis. In particular, the refractive index is equal to $n_e$ along the $K_{x'}$ axis. For angles between zero and 90 degrees, the refractive index is obtained using the function $$n_e(\theta) = \sqrt{\frac{\sin^2\theta}{n_e^2} + \frac{\cos^2\theta}{n_o^2}}.$$

This equation is proportional to the distance from the origin to a point on the ellipse that is an angle θ from the $K_z$ axis. The K-surface on the extraordinary wave will, therefore, be an ellipse (solid line) squashed in the $K_{x'}$ direction (since $n_e < n_o$ in αBBO).

This representation shows the orientations of the interacting K-vectors. The length of each vector is proportional to the refractive index along the vector's direction (assuming a fixed wavelength). The K-vector of a sound wave can also be represented using a K-surface representation (its length being proportional to $f_a/V_a$).

Figure 8A:
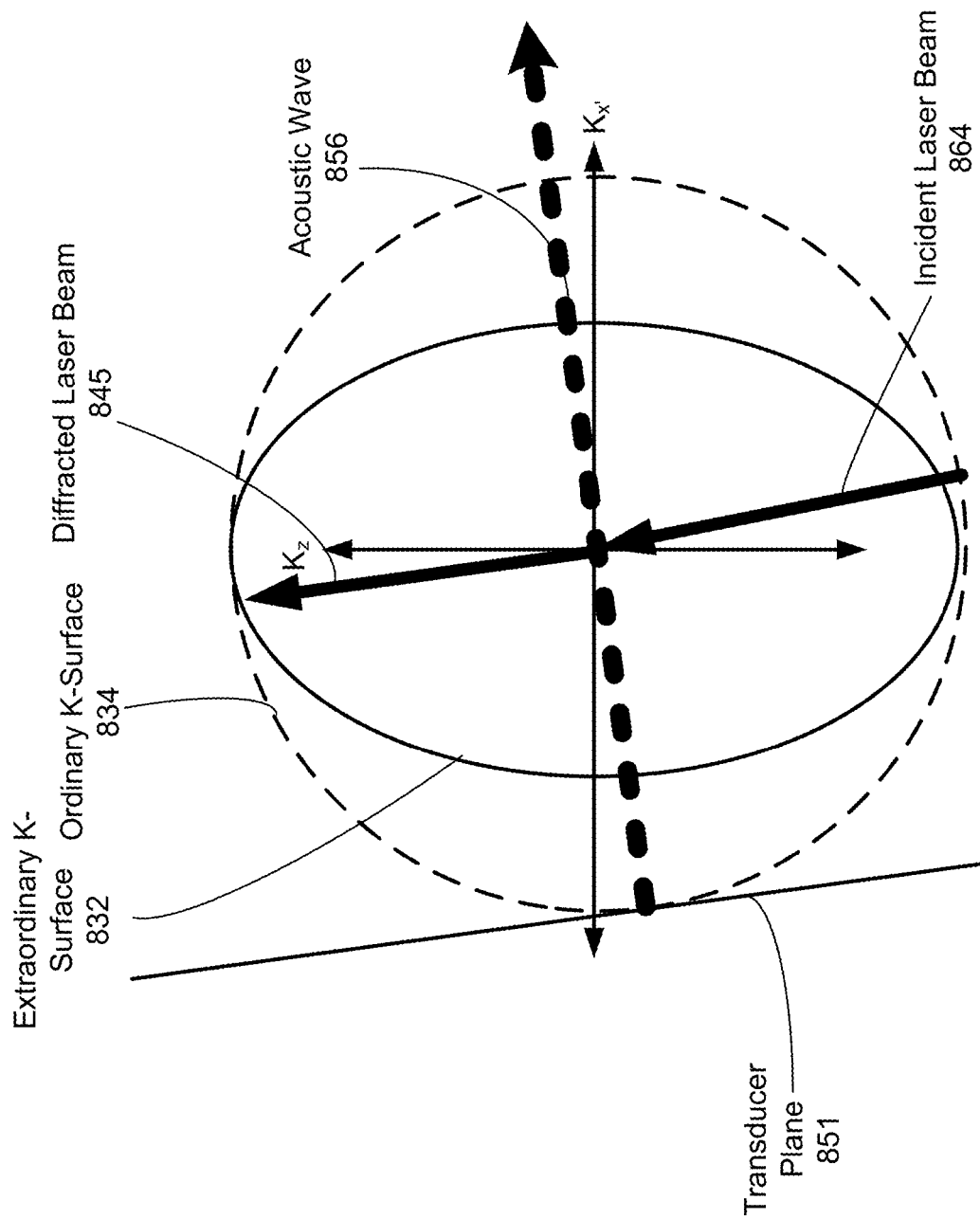
FIGS. 8A, 8B and 8C show K-surface diagrams for the acousto-optic interactions for the designs in the geometries table below.

FIG. 8A shows the acousto-optic interaction for Geometry 1, or 728. In FIG. 8A, the transducer plane 851 is oriented at 7.7 degrees counterclockwise from the $K_z$-axis and the acoustic wave 856 is launched 7.7 degrees counterclockwise from the $K_{x'}$ axis. The laser beam 864 is incident at an angle of 3.3 degrees counterclockwise from the transducer plane 851. The diffracted beam 845 is at an angle of 0 degrees from the transducer plane 851.

Figure 8B:
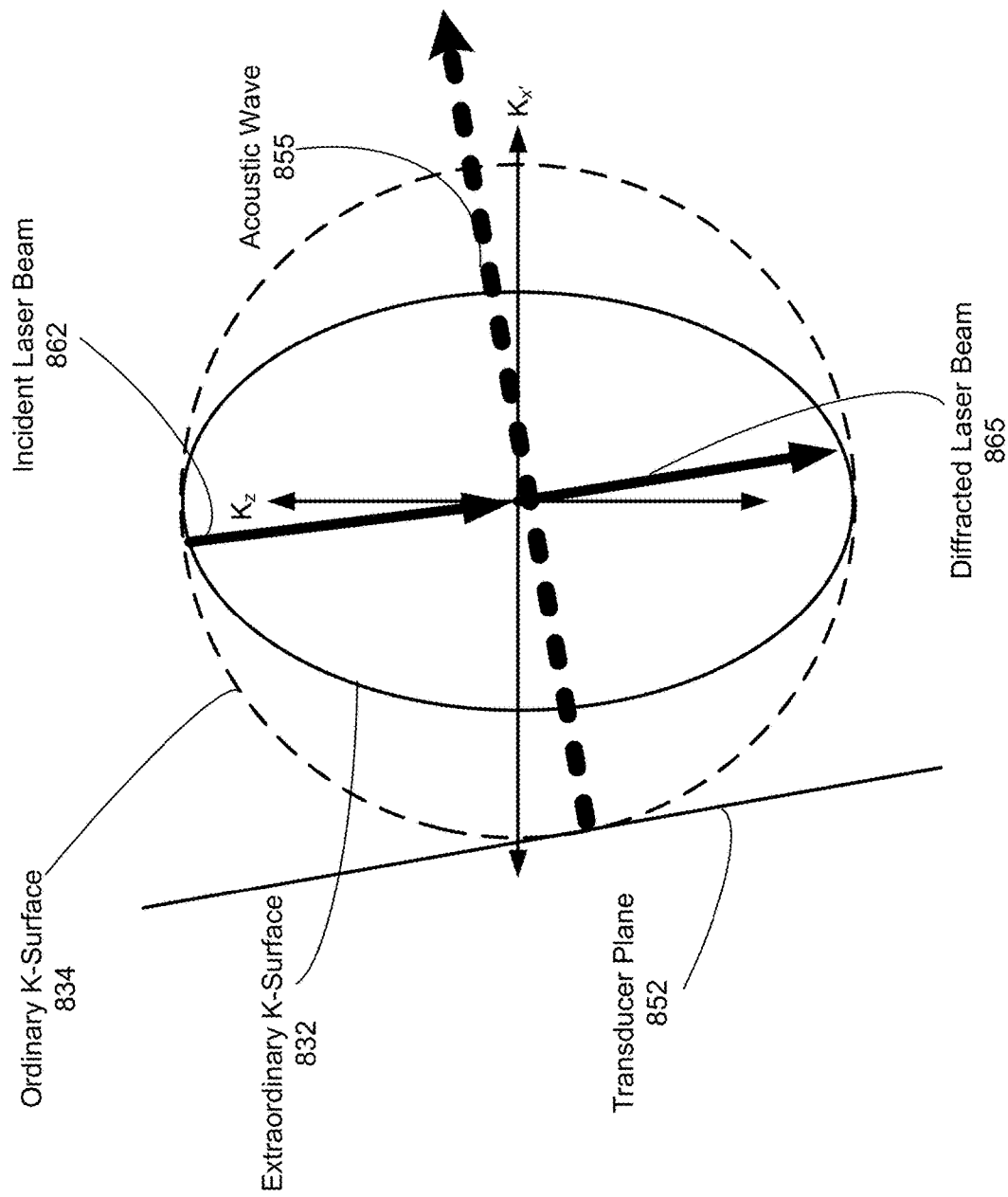

FIG. 8B shows the acousto-optic interaction for Geometries 2 and 4, or 762. In FIG. 8B, the transducer plane 852 is oriented at 10 degrees counterclockwise from the $K_z$-axis and the acoustic wave 855 is launched 10 degrees counterclockwise from the $K_{x'}$ axis. The laser beam 862 is incident at an angle of 3.9 degrees clockwise from the transducer plane 852. The diffracted beam 865 is at an angle of 0.8 degrees clockwise from the transducer plane 852.

Figure 8C:
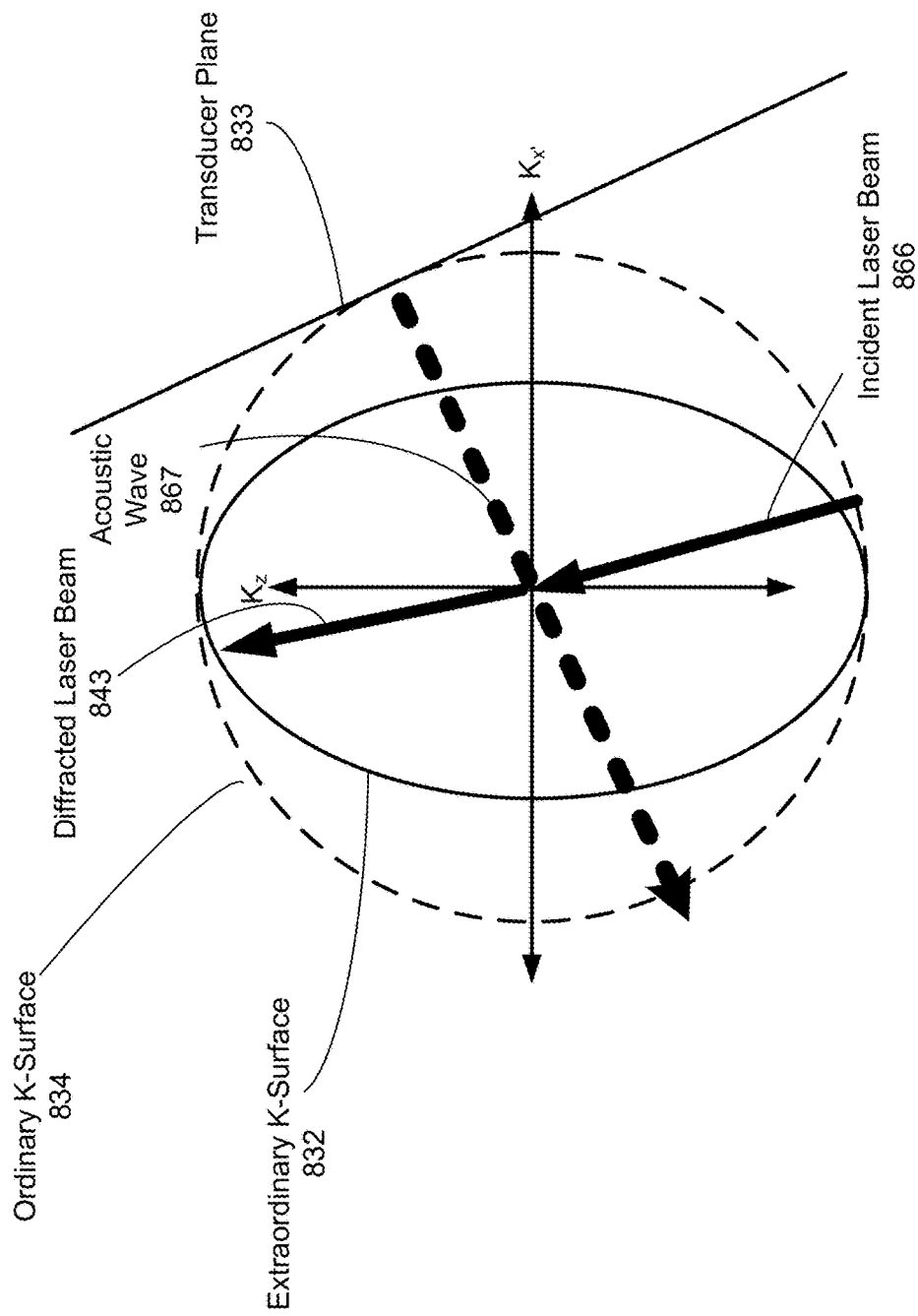

FIG. 8C shows the acousto-optic interaction for Geometry 3, or 768. In FIG. 8C, the transducer plane 833 is oriented at 205 degrees counterclockwise from the $K_z$-axis and the acoustic wave 856 is launched 205 degrees counterclockwise from the $K_{x'}$ axis. The laser beam 866 is incident at an angle of 9.7 degrees clockwise from the transducer plane 833. The diffracted beam 843 is at an angle of 5.5 degrees clockwise from the transducer plane.

Acousto-Optic Interaction

FIG. 9 shows an acousto-optic interaction in an implementation of the AOD that uses a divergent acoustic wave. A divergent acoustic wave 964 is launched from the transducer plane 962. The acoustic wave 964 is represented as multiple K-vectors launched within an angular spread of $\theta_a$, which is equal to 0.6 degrees in the figure. As indicated in the chart above, angular spreads of 0.35 to 1.0 degrees are appropriate under various conditions. An angular spread of 0.25 to 1.1 degrees also might be used. At least one of the K-vectors in the divergent wave satisfies a so-called Bragg matching condition. When the acoustic wave and incident beam interact, their momentum components sum. For some angles of incidence, this transfer causes a phase shift in the incident beam, aligning it in phase with the diffracted beam. Because momentum is conserved in this interaction, the k-vector of the diffracted wave is equal to the sum of the k-vectors of the incident wave and the acoustic wave. This allows the amplitude components of the incident and the diffracted beam to be summed constructively, increasing the intensity of the output beam. Thus, the interaction satisfies the Bragg matching condition. Because the divergent acoustic wave's K-vectors do not all propagate in the same direction, not all of them will satisfy the Bragg matching condition.

FIG. 10 shows a simplified diagram illustrating how the incident angle $\theta_i$ of an incident laser 1051 from parallel 1061 to the wavefront of an acoustic wave 1052 changes as the frequency of the acoustic wave 1052 is varied. This diagram is exaggerated, as the actual changes in incidence angle are much smaller than pictured. In addition, this diagram shows an effect for a non-divergent acoustic wave. In FIG. 10, the AOD is operated by scanning the acoustic frequency $f_a$ around the central frequency $f_c$ within the frequency range (or bandwidth) $\Delta f_a$. As the frequency is scanned from $f_1 = f_c - \Delta f_a/2$ to $f_2 = f_c + \Delta f_a/2$, the direction of the acoustic K-vector that best matches a Bragg condition for the interaction to take place changes slightly. An acousto-optic interaction will take place between the incident optical beam and the diffraction grating induced by the acoustic wave in the direction matching the Bragg condition. This causes the angle $\theta_i$ between the incident beam K-vector $k_i$ and the acoustic wavefront to vary even though the incident beam stays at a fixed angle $\theta_{i0}$ with respect to the transducer plane 1062.

Diagrams 1063, 1066, and 1069 show the interactions for each of the frequencies. In each diagram, the incident laser 1051 interacts with the acoustic wave 91052, which is launched from the transducer plane 1062. Diagram 1063 shows the interaction for $f_1$. Diagram 1066 shows the interaction for $f_c$. Diagram 1069 shows the interaction for $f_2$.

Figure 11:
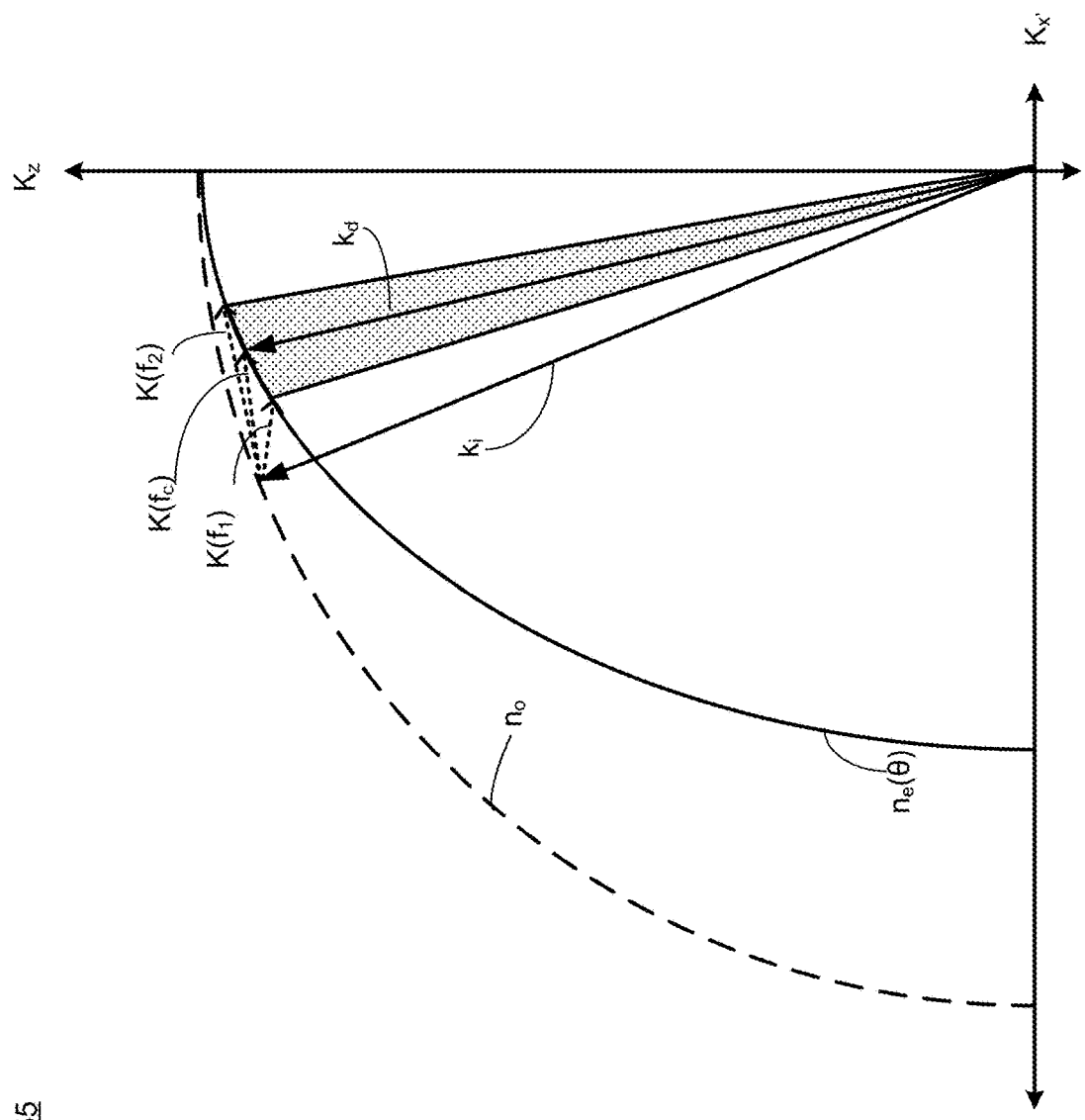
FIG. 11 illustrates an example K-surface representation diagrams and shows an acousto-optic interaction with a divergent acoustic wave as the angle of the acoustic K-vector changes.

FIG. 11 illustrates an example K-surface representation diagram 1155 showing an acousto-optic interaction with a divergent acoustic wave as the angle of the acoustic K-vector changes. In the diagram, the change in angle of the acoustic K-vector is exaggerated to simplify explanation of the physical phenomenon. In this diagram, $k_i$ is a vector in the direction of propagation of the incident wave, $k_d$ is a vector in the direction of propagation of the diffracted wave, and K is a divergent acoustic wave K-vector in the direction of launch of the acoustic wave. The dotted arrows show the change in direction of the acoustic K-vector with changing frequency, while the shaded region shows the range of directions of the output beam $k_d$ that satisfy the Bragg matching condition for the AO interaction between the incident beam $k_i$ and the divergent K-vectors.

As the frequency of the acoustic wave changes, the incident angle necessary to satisfy a Bragg matching condition also changes slightly. But the incidence angle of the incident laser beam in a geometry (such as one of the four calculated geometries) does not change. The divergence of the wave ensures that the AO interaction satisfies the Bragg matching condition for the incident and diffracted waves. This would not be the case if a non-divergent acoustic wave were used instead. Any deviation in the incident angle of the laser would fail to satisfy the Bragg matching condition, as no component of the acoustic wave's K-vector would be able to be added to the incident wave's k-vector. A non-divergent acoustic wave can be steered in order to satisfy the Bragg matching condition as the frequency of the acoustic wave is changed.

The birefringence of the αBBO crystal enables of the AOD to be operated in a wide bandwidth of frequencies when compared to AODs using isotropic materials. As seen in FIG. 11, the acoustic K-vector is tangent to the ellipse of refractive index $n_e(\theta)$. This property of birefringent crystals, called tangential phase matching, allows the diffracted beam to maintain high intensity when the acoustic wave is scanned within one octave of frequencies.

Figure 12:
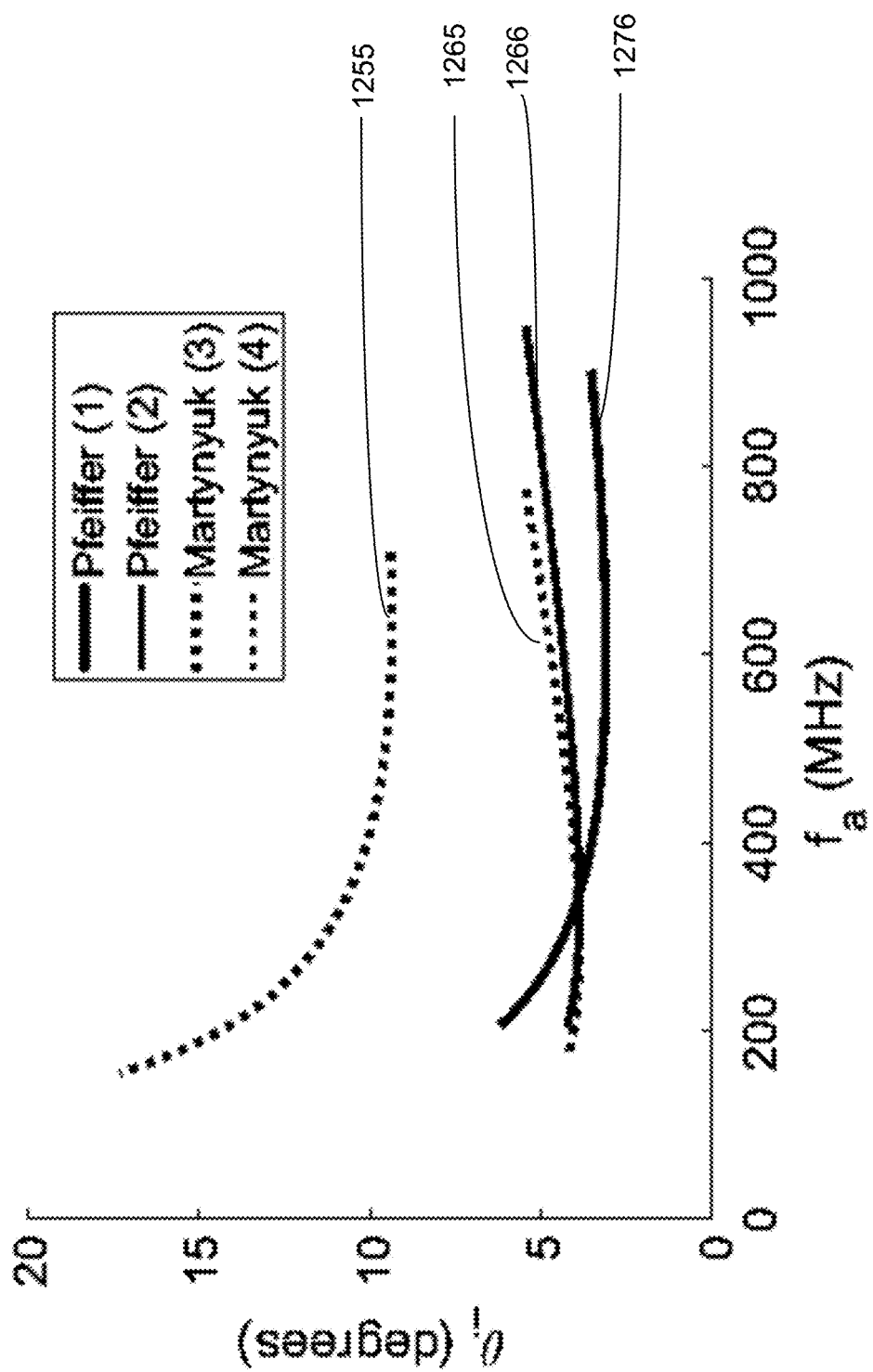
FIG. 12 shows the relationship between the RF driving frequency and the angle of the incident wave with respect to the (tilting) wavefront.

FIG. 12 shows the relationship between the RF driving frequency and the angle of the incident wave with respect to the (tilting) wavefront. Curves 1266 (Geometry 1) and 1276 (Geometry 2) show the relationships for the geometries using Pfeiffer's coefficients. Curves 1255 (Geometry 3) and 1265 (Geometry 4) show the relationships for the geometries using Martynyuk's coefficients. Within one octave, the angle range using Pfeiffer's coefficients is from 3.9 to 4.4 degrees. The angle range using Martynyuk's coefficients is from 3.8 to 4.7 degrees. The angles of incidence are chosen to produce diffracted beams with the highest figures of merit.

Figure 13:
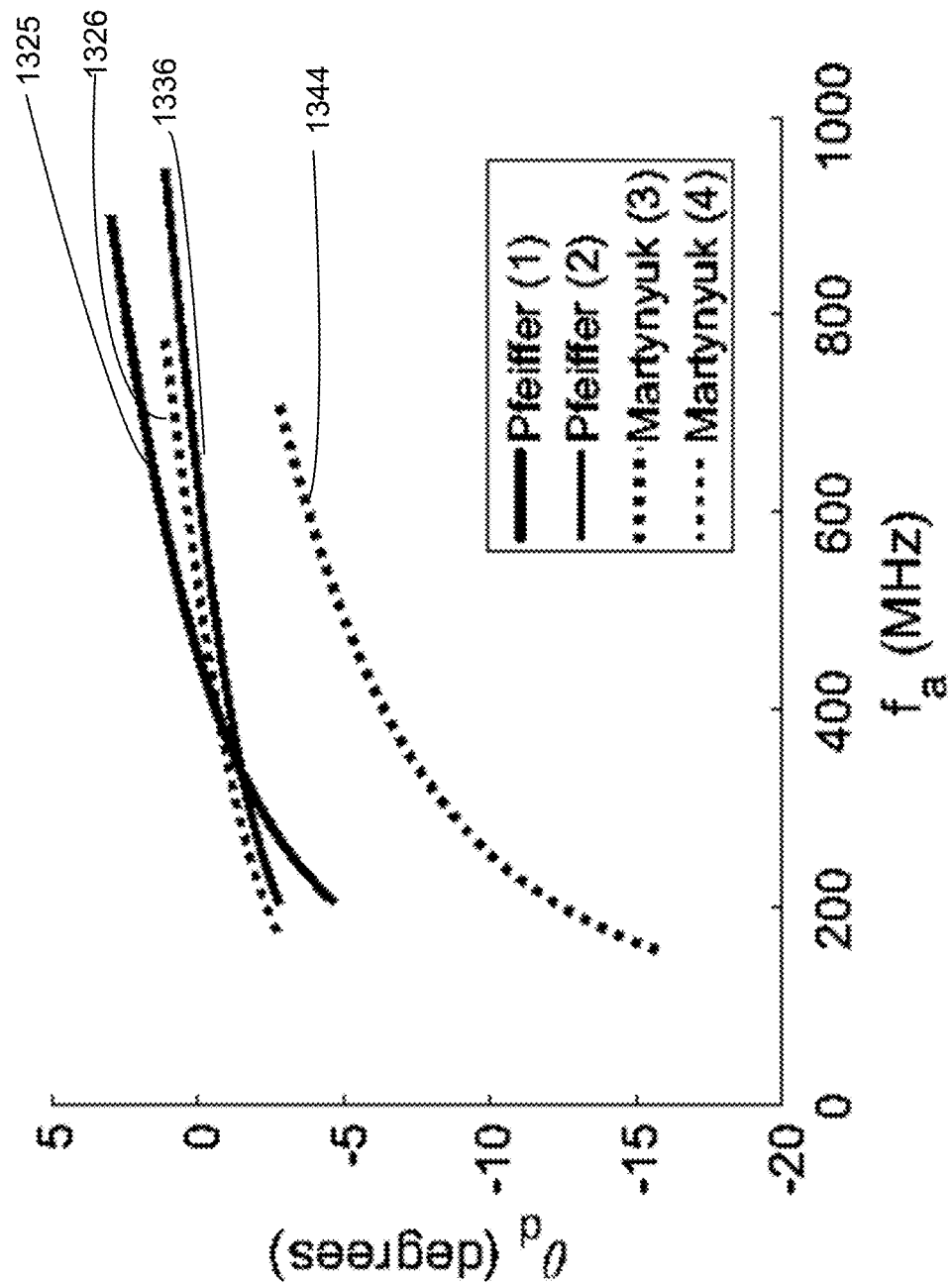
FIG. 13 shows the relationship between the RF driving frequency and the diffracted wave with respect to the acoustic wavefront.

FIG. 13 shows the relationship between the RF driving frequency and the diffracted wave with respect to the acoustic wavefront. Curves 1325 (Geometry 1) and 1336 (Geometry 2) show the relationships for the geometries using Pfeiffer's coefficients. Curves 1326 (Geometry 4) and 1344 (Geometry 3) show the relationships for the geometries using Martynyuk's coefficients. The angle of the wave increases as the frequency of the acoustic wave increases. As the frequency of the acoustic wave increases, the acoustic wave vector also rotates, as shown in FIG. 9. The angle $\theta_d$ therefore is not the angle between the diffracted light beam and any static axis. For the 300-600 MHz octave range, Pfeiffer's $\theta_d$ sweeps from −1.8 degrees to −0.1 degrees, while Martynyuk's angle sweeps from −1.3 degrees to 0.35 degrees.

Figure 14:
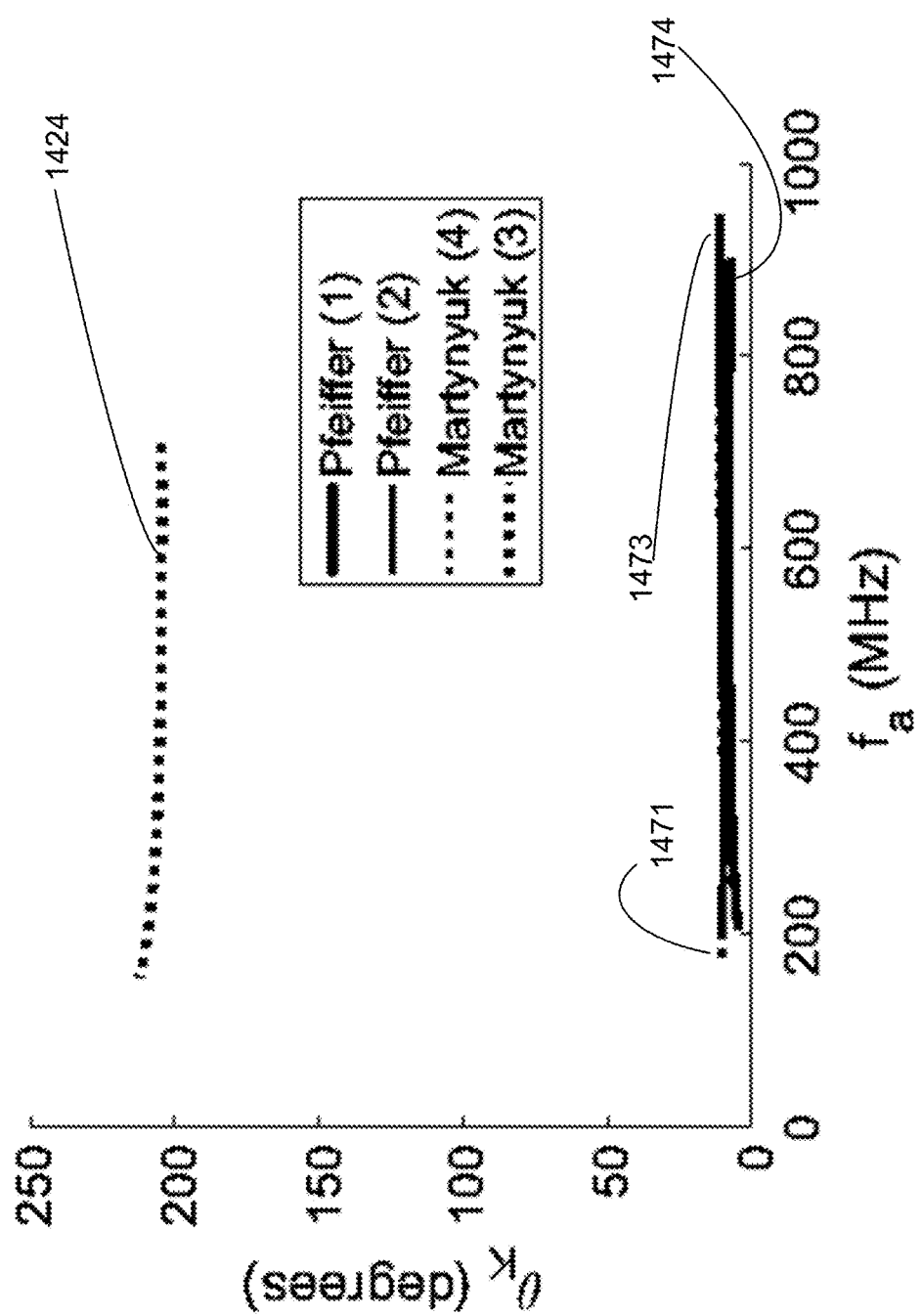
FIG. 14 illustrates a derived relationship between a frequency at which the AOD is driven and a preferred acoustic wave launch angle.

FIG. 14 illustrates a derived relationship between a frequency at which the AOD is driven and a preferred acoustic wave launch angle. Curves 1473 (Geometry 2) and 1474 (Geometry 1) show the relationships for the geometries using Pfeiffer's coefficients. Curves 1424 (Geometry 3) and 1471 (Geometry 4) show the relationships for the geometries using Martynyuk's coefficients. The angle $\theta_k$ is the angle $\theta_0$ of launch of the acoustic wave.

Alternative transducer designs and frequency ranges can be used with the AOD technology disclosed. In some implementations, the acoustic wave is divergent. Alternatively, multiple transducers can be used to steer the acoustic wave launch angle, so that the laser beam entry into the crystal is constant as the acoustic frequency ramps. The transducer can drive the acoustic wave signal through nearly an octave range of frequencies centered at about 450 MHz or starting at about 300 MHz. The frequency range does not exceed an octave because exceeding an octave would cause aliasing. A relatively low base starting frequency for the ramp reduces attenuation issues, as crystal to more strongly attenuate the acoustic waves at higher frequencies, requiring the transducer to use more power.

Figure 15:
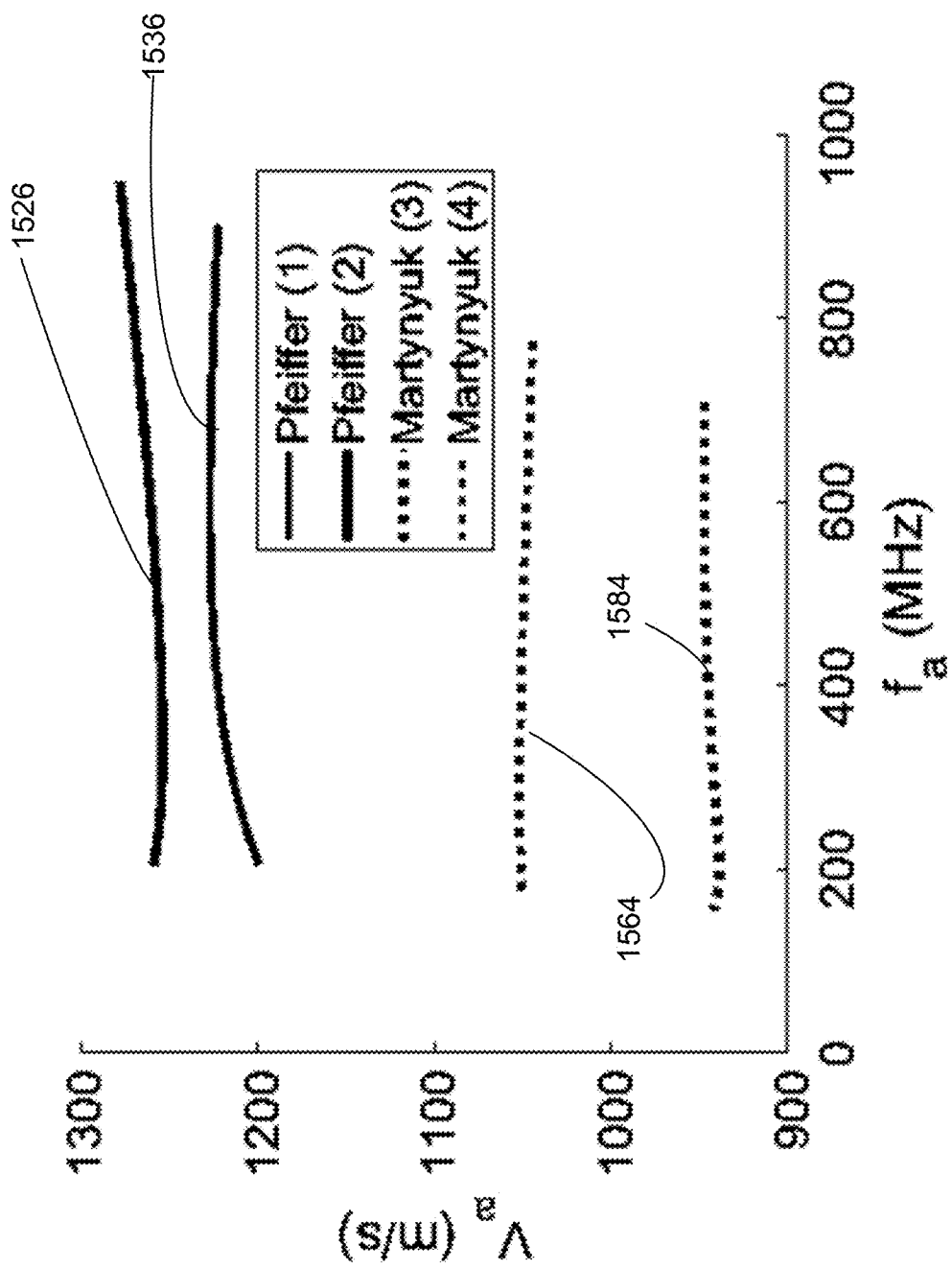
FIG. 15 shows the relationship between the acoustic wave frequency and the crystal speed of sound in the cases of both coefficient measurements.

FIG. 15 shows the relationship between the acoustic wave frequency and the crystal speed of sound in the cases of both coefficient measurements. Curves 1564 (Geometry 4) and 1584 (Geometry 3) show the relationships for the geometries using Martynyuk's coefficients. Curves 1526 (Geometry 2) and 1536 (Geometry 1) show the relationships for the geometries using Pfeiffer's coefficients. The speed of sound through the crystal is 1255±10 meters per second for Pfeiffer and 1049±2 meters per second for Martynyuk, in the indicated frequency ranges at the launch angles shown in FIG. 12.

In some implementations, the acoustic wave is divergent. Each portion of the acoustic wave traveling through the crystal experiences a different velocity. Only a specific portion of the divergent acoustic wave meets a Bragg matching condition in these implementations. For non-divergent acoustic waves, beam steering can be used to meet a Bragg matching condition.

Figure 16:
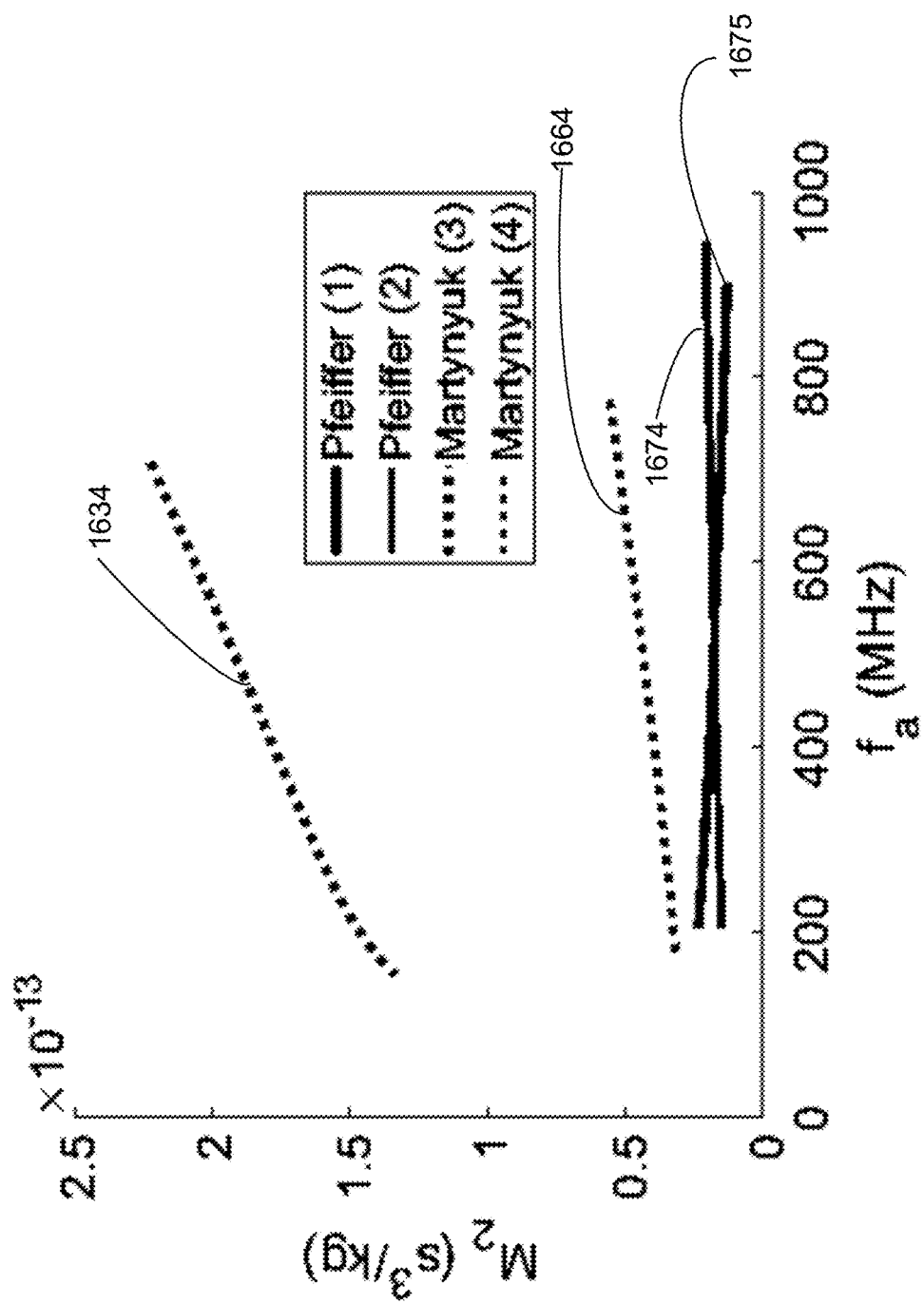
FIG. 16 is an illustration of the relationship between the RF driving frequency and the crystal's figure of merit.

FIG. 16 is an illustration of the relationship between the RF driving frequency and the crystal's figure of merit. Curves 1674 (Geometry 2) and 1675 (Geometry 1) show the relationships for the geometries using Pfeiffer's coefficients. Curves 1634 (Geometry 3) and 1664 (Geometry 4) show the relationships for the geometries using Martynyuk's coefficients. Using these coefficients, the figures of merit have been calculated by the inventor for orientations of the crystal, the incident light wave and the acoustic wave launch. The speed of sound in the crystal and the RF power needed to drive the transducer relate to figures of merit. The orientations of incident angles and launch angles in the charts for FIGS. 12-15 were chosen based on a selected figure of merit.

Several other figures of merit for materials exist, but the figure of merit sometimes called $M_2$ was used to design the disclosed AOD. The figure of merit $M_2$ is used because it enables the comparison of the acousto-optic interactions of different materials in a specific geometry. The figure of merit $M_2$ is calculated using the formula $$M_2 = \frac{n_d^3 n_i^3 p^2}{\rho V^3},$$

where $n_i$ is the index of refraction for the incident light wave, $n_d$ is the index of refraction for the diffracted light wave, p is a photoelectric constant, ρ is the density of the crystal, and V is the velocity of the acoustic wave.

Particular Implementations

We describe various implementations of a method for operating an acousto-optic device (AOD) component and devices configured to operate in the manner described. The technology disclosed can be practiced as a method, device or system making use of the device. One or more features of an implementation can be combined with the base implementation. Features that are not mutually exclusive are taught to be combinable. One or more features of an implementation can be combined with other implementations. This disclosure occasionally reminds the user of these options. Omission from some implementations of recitations that repeat these options should not be taken as limiting the combinations taught in the preceding sections—the option of combining features is hereby incorporated forward by reference into each of the following implementations.

Three sets of parameters, from among the parameters above, are called out, without intending to exclude other parameter sets indicated elsewhere. A person of skill in the art will follow the parameter sets provided and determine the parameter set best suited to a particular application that favors an AOD using an αBBO crystal in a slow speed of sound mode. At least two options for proceeding are sensible. After growing αBBO crystal(s), additional measurements could be made to select the current range of measured crystal properties. The first AOD built would be based on refined crystal property measurements. Alternatively, three AOD devices could be built to three different sets of parameters and operation of the three AODs characterized, before selecting one to use. Having three sets of design parameters to choose among should not deter a person of skill in the art.

A method implementation of the technology disclosed, with a first set of parameters, includes creating an acoustic coupling surface that is parallel to a transducer plane. The transducer plane is rotated in a range of 10±0.2 degrees from the optical axis of an αBBO crystal.

Another method implementation includes, relative to the optical axis of an αBBO crystal, launching an acoustical wavefront from a transducer plane. The transducer plane is oriented so that the acoustical wavefront can be launched at an angle of 10±0.2 degrees from an optic axis.

Another method implementation includes, relative to the optical axis of an αBBO crystal, launching an acoustical wavefront from a coupling surface and active transducers on the coupling surface. The transducers are driven by a coherent source with an optional phase difference. The acoustical wavefront is launched normal to a plane that is rotated from the optical axis by an angle that produces a transmission speed in a direction normal to the rotated plane of 1255±10 meters per second.

A method implementation of the technology disclosed includes creating an acoustic coupling surface that is parallel to a transducer plane. The transducer plane is rotated in a range of 10±0.2 degrees from the optical axis of an αBBO crystal.

Another method implementation includes, relative to the optical axis of an αBBO crystal, launching an acoustical wavefront from a transducer plane. The transducer plane is oriented so that the acoustical wavefront can be launched at an angle of 10±0.2 degrees from an optic axis.

Another method implementation includes, relative to the optical axis of an αBBO crystal, launching an acoustical wavefront from a coupling surface and active transducers on the coupling surface. The transducers are driven by a coherent source with an optional phase difference. The acoustical wavefront is launched normal to a plane that is rotated from the optical axis 1049±2 meters per second.

Each of the features discussed in this particular implementation section for these method implementations apply equally to device implementations. As indicated above, all the features are not repeated here and should be considered repeated by reference.

Next, we restate the methods above and add corresponding devices. One implementation is a method for producing an AOD component, comprising, relative to an optic axis of an αBBO crystal, creating an acoustical wavefront launched from a coupling surface and active transducers on the coupling surface that are driven by a coherent source with an optional phase difference. In this implementation, the acoustical wavefront is launched normal to a plane. The plane is a geometrical construct that may not have physical counterpart. The plane is rotated in a in a range of 10±0.2 degrees from the optic axis and rotated counter-clockwise in a range of 63.5±1.0 degrees from an a-axis of the αBBO crystal, or trigonal by 120 degrees from that rotation. The launch can produce a divergent wavefront and the angle of launch can be swept, as described below. Features that can be combined with this method include the following and features described elsewhere in this application.

The acoustical wavefront of this method can have a divergent angular spread of 0.35 to 1.0 degrees, or, more broadly, a divergent angular spread of 0.25 to 1.1 degrees.

The method can include applying a signal to the active transducers centered at 450 MHz, ±50 MHz. This signal can have a frequency sweep of 300 MHz, ±50 MHz, about the specified center frequency or about a different center frequency.

The method can further include creating an acoustical coupling surface that is parallel to a transducer plane. Relative to the optic axis of an αBBO crystal, the transducer plane can be rotated in a range of 10±0.2 degrees from the optic axis and rotated counter-clockwise in a range of 63.5±1.0 degrees from the a-axis of the αBBO crystal, or trigonal by 120 degrees from that rotation. This acoustical coupling surface feature can be combined with one or more features of the method.

The method can further include creating an acoustical coupling surface, to which one or more transducers are coupled, that is coincident with the plane normal to the acoustical wavefront. The acoustical wavefront can be launched at an angle that produces an acoustic transmission speed in a direction of the launch of 1255±10 meters per second, as a feature or part of a combination of features.

Each method feature also applies to a device, particularly to an AOD component, that includes an αBBO crystal with a coupling surface on the αBBO crystal and active transducers on the coupling surface. The active transducers are coupled to a coherent driving source with an optional phase difference. Relative to an optic axis of the αBBO crystal, the active transducers and the coherent driving source are configured to launch an acoustical wavefront normal to a plane. The plane is rotated in a range of 10±0.2 degrees from the optic axis and rotated counter-clockwise in a range of 63.5±1.0 degrees from an a-axis of the αBBO crystal, or trigonal by 120 degrees from that rotation.

The active transducers and the coherent driving source can be configured to induce the acoustical wavefront with a divergent angular spread of 0.35 to 1.0 degrees, or at a broader divergent angular spread of 0.25 to 1.1 degrees.

A signal from the coherent driving source to the active transducers can be centered at 450 MHz, ±50 MHz. This signal can have a frequency sweep of 300 MHz, ±50 MHz, about the specified center frequency or about a different center frequency.

This device can further include an acoustical coupling surface that is parallel to a transducer plane. Relative to the optic axis of an αBBO crystal, the transducer plane can be rotated in a range of 10±0.2 degrees from the optic axis and rotated counter-clockwise in a range of 63.5±1.0 degrees from the a-axis of the αBBO crystal, or trigonal by 120 degrees from that rotation.

The device can further include an acoustical coupling surface, to which one or more transducers are coupled, that is coincident with the plane normal to the acoustical wavefront. The acoustical wavefront launch is further configured to produce an acoustic transmission speed in a direction of the launch of 1255±10 meters per second, as a feature or part of a combination of features.

The method and device and their features can, alternatively be practiced with other sets of parameters, generally as set forth in the table above. An implementation with a second set of parameters is a method for producing an AOD component, comprising, relative to an optic axis of an αBBO crystal, creating an acoustical wavefront launch from a coupling surface and active transducers on the coupling surface that are driven by a coherent source with an optional phase difference. In this implementation, the acoustical wavefront is launched normal to a plane. The plane is rotated in a range of 7.7±0.2 degrees from the optic axis and rotated counter-clockwise in a range of 64.5±2.5 degrees from an a-axis of the αBBO crystal, or trigonal by 120 degrees from that rotation. The launch can produce a divergent wavefront and the angle of launch can be swept, as described below. Features that can be combined with this method include the following and other features described in this application.

The acoustical wavefront of this method can have a divergent angular spread of 0.35 to 1.0 degrees, or, more broadly, a divergent angular spread of 0.25 to 1.1 degrees.

The method can include applying a signal to the active transducers centered at 450 MHz, ±50 MHz. This signal can have a frequency sweep of 300 MHz, ±50 MHz, about the specified center frequency or about a different center frequency.

The method can further include creating an acoustical coupling surface that is parallel to a transducer plane. Relative to the optic axis of an αBBO crystal, the transducer plane can be rotated in a range of 7.7±0.2 degrees from the optic axis and rotated counter-clockwise in a range of 64.5±2.5 degrees from the a-axis of the αBBO crystal, or trigonal by 120 degrees from that rotation. This acoustical coupling surface feature can be combined with one or more features of the method.

The method can further include creating an acoustical coupling surface, to which one or more transducers are coupled, that is coincident with the plane normal to the acoustical wavefront. The acoustical wavefront can be launched at an angle that produces an acoustic transmission speed in a direction of the launch of 1220±7 meters per second, as a feature or part of a combination of features.

Each method feature also applies to a device, particularly to an AOD component, that includes an αBBO crystal with a coupling surface on the αBBO crystal and active transducers on the coupling surface. This device can be implemented using the second set of parameters stated for the method above. The active transducers are coupled to a coherent driving source with an optional phase difference. Relative to an optic axis of the αBBO crystal, the active transducers and the coherent driving source are configured to launch an acoustical wavefront normal to a plane. The plane is rotated in a in a range of 7.7±0.2 degrees from the optic axis and rotated counter-clockwise in a range of 64.5±2.5 degrees from an a-axis of the αBBO crystal, or trigonal by 120 degrees from that rotation.

The active transducers and the coherent driving source can be configured to induce the acoustical wavefront with a divergent angular spread of 0.35 to 1.0 degrees, or at a broader divergent angular spread of 0.25 to 1.1 degrees.

A signal from the coherent driving source to the active transducers can be centered at 450 MHz, ±50 MHz. This signal can have a frequency sweep of 300 MHz, ±50 MHz, about the specified center frequency or about a different center frequency.

This device can further include an acoustical coupling surface that is parallel to a transducer plane. Relative to the optic axis of an αBBO crystal, the transducer plane can be rotated in a range of 10±0.2 degrees from the optic axis and rotated counter-clockwise in a range of 63.5±1.0 degrees from the a-axis of the αBBO crystal, or trigonal by 120 degrees from that rotation.

The device can further include an acoustical coupling surface, to which one or more transducers are coupled, that is coincident with the plane normal to the acoustical wavefront. The acoustical wavefront launch is further configured to produce an acoustic transmission speed in a direction of the launch of 1220±7 meters per second, as a feature or part of a combination of features.

An implementation with a third set of parameters is a method for producing an AOD component, comprising, relative to an optic axis of an αBBO crystal, creating an acoustical wavefront launch from a coupling surface and active transducers on the coupling surface that are driven by a coherent source with an optional phase difference. In this implementation, the acoustical wavefront is launched normal to a plane. The plane is rotated in a in a range of 205±0.2 degrees from the optic axis and rotated counter-clockwise in a range of 80±1.0 degrees from an a-axis of the αBBO crystal, or trigonal by 120 degrees from that rotation. The launch can produce a divergent wavefront and the angle of launch can be swept, as described below. Features that can be combined with this method include the following and other features described in this application.

The acoustical wavefront of this method can have a divergent angular spread of 0.35 to 1.0 degrees, or, more broadly, a divergent angular spread of 0.25 to 1.1 degrees.

The method can include applying a signal to the active transducers centered at 450 MHz, ±50 MHz. This signal can have a frequency sweep of 300 MHz, ±50 MHz, about the specified center frequency or about a different center frequency.

The method can further include creating an acoustical coupling surface that is parallel to a transducer plane. Relative to the optic axis of an αBBO crystal, the transducer plane can be rotated in a range of 205±0.2 degrees from the optic axis and rotated counter-clockwise in a range of 80±1.0 degrees from the a-axis of the αBBO crystal, or trigonal by 120 degrees from that rotation. This acoustical coupling surface feature can be combined with one or more features of the method.

The method can further include creating an acoustical coupling surface, to which one or more transducers are coupled, that is coincident with the plane normal to the acoustical wavefront. The acoustical wavefront can be launched at an angle that produces an acoustic transmission speed in a direction of the launch of 944±3 meters per second, as a feature or part of a combination of features.

Each method feature also applies to a device, particularly to an AOD component, that includes an αBBO crystal with a coupling surface on the αBBO crystal and active transducers on the coupling surface. This device can be implemented using the third set of parameters stated for the method above. The active transducers are coupled to a coherent driving source with an optional phase difference. Relative to an optic axis of the αBBO crystal, the active transducers and the coherent driving source are configured to launch an acoustical wavefront normal to a plane. The plane is rotated in a range of 205±0.2 degrees from the optic axis and rotated counter-clockwise in a range of 80±1.0 degrees from an a-axis of the αBBO crystal, or trigonal by 120 degrees from that rotation.

The active transducers and the coherent driving source can be configured to induce the acoustical wavefront with a divergent angular spread of 0.35 to 1.0 degrees, or at a broader divergent angular spread of 0.25 to 1.1 degrees.

A signal from the coherent driving source to the active transducers can be centered at 450 MHz, ±50 MHz. This signal can have a frequency sweep of 300 MHz, ±50 MHz, about the specified center frequency or about a different center frequency.

This device can further include an acoustical coupling surface that is parallel to a transducer plane. Relative to the optic axis of an αBBO crystal, the transducer plane can be rotated in a range of 205±0.2 degrees from the optic axis and rotated counter-clockwise in a range of 80±1.0 degrees from the a-axis of the αBBO crystal, or trigonal by 120 degrees from that rotation.

The device can further include an acoustical coupling surface, to which one or more transducers are coupled, that is coincident with the plane normal to the acoustical wavefront. The acoustical wavefront launch is further configured to produce an acoustic transmission speed in a direction of the launch of 944±3 meters per second, as a feature or part of a combination of features.

Clauses

1. Device 10±0.2

Clause 1. An AOD component, comprising:
an αBBO crystal;
a coupling surface on the αBBO crystal;
active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
  rotated in a in a range of 10±0.2 degrees from the optic axis and
  rotated counter-clockwise in a range of 63.5±1.0 degrees or in a range of 70±1.0 degrees from an a-axis of the αBBO crystal, or trigonal by 120 degrees from that rotation.

Clause 2. The AOD component of clause 1, wherein:
the active transducers and the coherent driving source are configured to induce the acoustical wavefront with a divergent angular spread of 0.4 to 1.0 degrees.

Clause 3. The AOD component of clause 1, wherein:
the active transducers and the coherent driving source are configured to induce the acoustical wavefront with a divergent angular spread of 0.5 to 0.7 degrees.

Clause 4. The AOD component of any of clauses 1-3, wherein:
a signal from the coherent driving source to the active transducers is centered at 450 MHz, ±50 MHz.

Clause 5. The AOD component of any of clauses 1-4, further comprising:
a signal from the coherent driving source to the active transducers has a frequency sweep of 300 MHz, ±50 MHz.

Clause 6. The AOD component of any of clauses 1-5, wherein:
the αBBO crystal includes an acoustical coupling surface that is parallel to a transducer plane that is
  rotated in a range of 10±0.2 degrees from the optic axis and
  rotated counter-clockwise in a range of 63.5±1.0 degrees or in a range of 70±1.0 degrees from the a-axis of the αBBO crystal, or trigonal by 120 degrees from that rotation.

Clause 7. The AOD component of any of clauses 1-6, further comprising:
an acoustical coupling surface, to which one or more transducers are coupled, that is coincident with the plane normal to the acoustical wavefront.

Clause 8. The AOD component of any of clauses 1-7, wherein:
the acoustical wavefront launch is further configured to produce an acoustic transmission speed in a direction of the launch of 1255±10 meters per second.

Clause 9. A method for producing an AOD component, comprising:
relative to an optic axis of an αBBO crystal, creating an acoustical wavefront launch from a coupling surface and active transducers on the coupling surface that are driven by a coherent source with an optional phase difference,
wherein the acoustical wavefront is launched normal to a plane, wherein the plane is
  rotated in a in a range of 10±0.2 degrees from the optic axis and
  rotated counter-clockwise in a range of 63.5±1.0 degrees or in a range of 70±1.0 degrees from an a-axis of the αBBO crystal, or trigonal by 120 degrees from that rotation.

Clause 10. The method of clause 9, further wherein:
the acoustical wavefront has a divergent angular spread of 0.4 to 1.0 degrees.

Clause 11. The method of clause 9, further wherein:
the acoustical wavefront has a divergent angular spread of 0.5 to 0.7 degrees.

Clause 12. The method of any of clauses 9-11, further comprising:
applying a signal to the active transducers centered at 450 MHz, ±50 MHz.

Clause 13. The method of any of clauses 9-12, further comprising:
applying a signal to the active transducers with a frequency sweep of 300 MHz, ±50 MHz.

Clause 14. The method of any of clauses 9-13, further comprising:
relative to the optic axis of an αBBO crystal, creating an acoustical coupling surface that is parallel to a transducer plane,
wherein the transducer plane is a plane that is
  rotated in a range of 10±0.2 degrees from the optic axis and
  rotated counter-clockwise in a range of 63.5±1.0 degrees or in a range of 70±1.0 degrees from the a-axis of the αBBO crystal, or trigonal by 120 degrees from that rotation.

Clause 15. The method of any of clauses 9-14, further comprising:
creating an acoustical coupling surface, to which one or more transducers are coupled, that is coincident with the plane normal to the acoustical wavefront.

16. The method of any of clauses 9-15, wherein:
the acoustical wavefront is launched at an angle that produces an acoustic transmission speed in a direction of the launch of 1255±10 meters per second.

17. Device 7.7±0.2

Clause 17. An AOD component, comprising:
an αBBO crystal;
a coupling surface on the αBBO crystal;

active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
rotated in a in a range of 7.7±0.2 degrees from the optic axis and
rotated counter-clockwise in a range of 64.5±2.5 degrees from an a-axis of the αBBO crystal, or trigonal by 120 degrees from that rotation.

Clause 18. The AOD component of clause 17, wherein:
the active transducers and the coherent driving source are configured to induce the acoustical wavefront with a divergent angular spread of 1.1 to 1.3 degrees.

Clause 19. The AOD component of clause 17, wherein:
the active transducers and the coherent driving source are configured to induce the acoustical wavefront with a divergent angular spread of 1.15 to 1.25 degrees.

Clause 20. The AOD component of any of clauses 17-19, wherein:
a signal from the coherent driving source to the active transducers is centered at 450 MHz, ±50 MHz.

Clause 21. The AOD component of any of clauses 17-20, further comprising:
a signal from the coherent driving source to the active transducers has a frequency sweep of 300 MHz, ±50 MHz.

Clause 22. The AOD component of any of clauses 17-21, wherein:
the αBBO crystal includes an acoustical coupling surface that is parallel to a transducer plane that is
rotated in a range of 7.7±0.2 degrees from the optic axis and
rotated counter-clockwise in a range of 64.5±2.5 degrees from the a-axis of the αBBO crystal, or trigonal by 120 degrees from that rotation.

Clause 23. The AOD component of clause 17, further comprising:
an acoustical coupling surface, to which one or more transducers are coupled, that is coincident with the plane normal to the acoustical wavefront.

Clause 24. The AOD component of any of clauses 17-22, wherein:
the acoustical wavefront launch is further configured to produce an acoustic transmission speed in a direction of the launch of 1220±7 meters per second.

Clause 25. A method for producing an AOD component, comprising:
relative to the optic axis of an αBBO crystal, creating an acoustical wavefront launch from a coupling surface and active transducers on the coupling surface that are driven by a coherent source with an optional phase difference,
wherein the acoustical wavefront is launched normal to a plane, wherein the plane is
rotated in a range of 7.7±0.2 degrees from the optic axis and
rotated counter-clockwise in a range of 64.5±2.5 degrees from an a-axis of the αBBO crystal, or trigonal by 120 degrees from that rotation.

Clause 26. The method of clause 25, further wherein:
the acoustical wavefront has a divergent angular spread of 1.1 to 1.3 degrees.

Clause 27. The method of clause 25, further wherein:
the acoustical wavefront has a divergent angular spread of 1.15 to 1.25 degrees.

Clause 28. The method of any of clauses 25-27, further comprising:
applying a signal to the active transducers centered at 450 MHz, ±50 MHz.

Clause 29. The method of clauses 25-28, further comprising:
applying a signal to the active transducers with a frequency sweep of 300 MHz, ±50 MHz.

Clause 30. The method of clauses 25-29, further comprising:
creating an acoustical coupling surface that is parallel to a transducer plane,
wherein the transducer plane is a plane that is
rotated in a range of 7.7±0.2 degrees from the optic axis and
rotated counter-clockwise in a range of 64.5±2.5 degrees from the a-axis of the αBBO crystal, or trigonal by 120 degrees from that rotation.

Clause 31. The method of clauses 25-30, further comprising:
relative to the optic axis of an αBBO crystal, creating an acoustical coupling surface, to which one or more transducers are coupled, that is coincident with the plane normal to the acoustical wavefront.

Clause 32. The method of clauses 25-31, wherein:
the acoustical wavefront is launched at an angle that produces an acoustic transmission speed in a direction of the launch of 1220±7 meters per second.

33. Device 205±0.2

Clause 33. An AOD component, comprising:
an αBBO crystal;
a coupling surface on the αBBO crystal;
active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
rotated in a in a range of 205±0.2 degrees from the optic axis and
rotated counter-clockwise in a range of 80±1.0 degrees from an a-axis of the αBBO crystal, or trigonal by 120 degrees from that rotation.

Clause 34. The AOD component of clause 33, wherein:
the active transducers and the coherent driving source are configured to induce the acoustical wavefront with a divergent angular spread of 1.8 to 2.2 degrees.

Clause 35. The AOD component of clause 33, wherein:
the active transducers and the coherent driving source are configured to induce the acoustical wavefront with a divergent angular spread of 1.9 to 2.1 degrees.

Clause 36. The AOD component of clauses 33-35, wherein:
a signal from the coherent driving source to the active transducers is centered at 450 MHz, ±50 MHz.

Clause 37. The AOD component of clauses 33-36, further comprising:
a signal from the coherent driving source to the active transducers has a frequency sweep of 300 MHz, ±50 MHz.

Clause 38. The AOD component of clauses 33-37, wherein:
the αBBO crystal includes an acoustical coupling surface that is parallel to a transducer plane that is
rotated in a range of 205±0.2 degrees from the optic axis and rotated counter-clockwise in a range of 80±1.0 degrees from the a-axis of the αBBO crystal, or trigonal by 120 degrees from that rotation.

Clause 39. The AOD component of clauses 33-38, further comprising:

an acoustical coupling surface, to which one or more transducers are coupled, that is coincident with the plane normal to the acoustical wavefront.

Clause 40. The AOD component of clauses 33-39, wherein:

the acoustical wavefront launch is further configured to produce an acoustic transmission speed in a direction of the launch of 944±3 meters per second.

Clause 41. A method for producing an AOD component, comprising:

relative to the optic axis of an αBBO crystal, creating an acoustical wavefront launch from a coupling surface and active transducers on the coupling surface that are driven by a coherent source with an optional phase difference, wherein the acoustical wavefront is launched normal to a plane, wherein the plane is
rotated in a range of 205±0.2 degrees from the optic axis and
rotated counter-clockwise in a range of 80±1.0 degrees from an a-axis of the αBBO crystal, or trigonal by 120 degrees from that rotation.

Clause 42. The method of clause 41, further wherein:
the acoustical wavefront has a divergent angular spread of 1.8 to 2.2 degrees.

Clause 43. The method of clause 41, further wherein:
the acoustical wavefront has a divergent angular spread of 1.9 to 2.1 degrees.

Clause 44. The method of clauses 41-43, further comprising:
applying a signal to the active transducers centered at 450 MHz, ±50 MHz.

Clause 45. The method of clauses 41-44, further comprising:
applying a signal to the active transducers with a frequency sweep of 300 MHz, ±50 MHz.

Clause 46. The method of clauses 41-45, further comprising:
creating an acoustical coupling surface that is parallel to a transducer plane,
wherein the transducer plane is a plane that is
rotated in a range of 205±0.2 degrees from the optic axis and
rotated counter-clockwise in a range of 80±1.0 degrees from the a-axis of the αBBO crystal, or trigonal by 120 degrees from that rotation.

Clause 47. The method of clauses 41-46, further comprising:
relative to the optic axis of an αBBO crystal, creating an acoustical coupling surface, to which one or more transducers are coupled, that is coincident with the plane normal to the acoustical wavefront.

Clause 48. The method of clauses 41-47, wherein:
the acoustical wavefront is launched at an angle that produces an acoustic transmission speed in a direction of the launch of 944±3 meters per second.

I claim as follows:

1. An acousto-optic device (AOD) component, comprising:
an alpha-barium borate (αBBO) crystal;
a coupling surface on the αBBO crystal;
active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
rotated in a range of 10±0.2 degrees from the optic axis and
rotated counter-clockwise in a range of 63.5±1.0 degrees or in a range of 70±1.0 degrees from an a-axis of the αBBO crystal, or trigonal by 120 degrees from that rotation.

2. The AOD component of claim 1, wherein:
the active transducers and the coherent driving source are configured to induce the acoustical wavefront with a divergent angular spread of 0.4 to 1.0 degrees.

3. The AOD component of claim 1, wherein:
the active transducers and the coherent driving source are configured to induce the acoustical wavefront with a divergent angular spread of 0.5 to 0.7 degrees.

4. The AOD component of claim 1, wherein:
a signal from the coherent driving source to the active transducers is centered at 450 MHz, ±50 MHz.

5. The AOD component of claim 1, further comprising:
a signal from the coherent driving source to the active transducers has a frequency sweep of 300 MHz, ±50 MHz.

6. The AOD component of claim 1, wherein:
the αBBO crystal includes an acoustical coupling surface that is parallel to a transducer plane that is
rotated in a range of 10±0.2 degrees from the optic axis and
rotated counter-clockwise in a range of 63.5±1.0 degrees or in a range of 70±1.0 degrees from the a-axis of the αBBO crystal, or trigonal by 120 degrees from that rotation.

7. The AOD component of claim 1, further comprising:
an acoustical coupling surface, to which one or more transducers are coupled, that is coincident with the plane normal to the acoustical wavefront.

8. The AOD component of claim 1, wherein:
the acoustical wavefront launch is further configured to produce an acoustic transmission speed in a direction of the launch of 1255±10 meters per second.

9. A method for producing an acousto-optic device (AOD) component, comprising:
relative to an optic axis of an alpha-barium borate (αBBO) crystal, creating an acoustical wavefront launch from a coupling surface and active transducers on the coupling surface that are driven by a coherent source with an optional phase difference,
wherein the acoustical wavefront is launched normal to a plane, wherein the plane is rotated in a range of 10±0.2 degrees from the optic axis and
rotated counter-clockwise in a range of 63.5±1.0 degrees or in a range of 70±1.0 degrees from an a-axis of the αBBO crystal, or trigonal by 120 degrees from that rotation.

10. The method of claim 9, further wherein:
the acoustical wavefront has a divergent angular spread of 0.4 to 1.0 degrees.

11. The method of claim 9, further wherein:
the acoustical wavefront has a divergent angular spread of 0.5 to 0.7 degrees.

12. The method of claim 9, further comprising:
applying a signal to the active transducers centered at 450 MHz, ±50 MHz.

13. The method of claim 9, further comprising:
applying a signal to the active transducers with a frequency sweep of 300 MHz, ±50 MHz.

14. The method of claim 9, further comprising:
relative to the optic axis of an αBBO crystal, creating an acoustical coupling surface that is parallel to a transducer plane,
wherein the transducer plane is a plane that is
rotated in a range of 10±0.2 degrees from the optic axis and
rotated counter-clockwise in a range of 63.5±1.0 degrees or in a range of 70±1.0 degrees from the a-axis of the αBBO crystal, or trigonal by 120 degrees from that rotation.

15. The method of claim 9, further comprising:
creating an acoustical coupling surface, to which one or more transducers are coupled, that is coincident with the plane normal to the acoustical wavefront.

16. The method of claim 9, wherein:
the acoustical wavefront is launched at an angle that produces an acoustic transmission speed in a direction of the launch of 1255±10 meters per second.

17. An acousto-optic device (AOD) component, comprising:
an alpha-barium borate (αBBO) crystal;
a coupling surface on the αBBO crystal;
active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
rotated in a range of 7.7±0.2 degrees from the optic axis and
rotated counter-clockwise in a range of 64.5±2.5 degrees from an a-axis of the αBBO crystal, or trigonal by 120 degrees from that rotation.

18. The AOD component of claim 17, wherein:
the active transducers and the coherent driving source are configured to induce the acoustical wavefront with a divergent angular spread of 1.1 to 1.3 degrees.

19. The AOD component of claim 17, wherein:
a signal from the coherent driving source to the active transducers is centered at 450 MHz, ±50 MHz.

20. The AOD component of claim 17, wherein:
the αBBO crystal includes an acoustical coupling surface that is parallel to a transducer plane that is
rotated in a range of 7.7±0.2 degrees from the optic axis and
rotated counter-clockwise in a range of 64.5±2.5 degrees from the a-axis of the αBBO crystal, or trigonal by 120 degrees from that rotation.

21. The AOD component of claim 17, wherein:
the acoustical wavefront launch is further configured to produce an acoustic transmission speed in a direction of the launch of 1220±7 meters per second.

22. An acousto-optic device (AOD) component, comprising:
an alpha-barium borate (αBBO) crystal;
a coupling surface on the αBBO crystal;
active transducers on the coupling surface;
the active transducers coupled to a coherent driving source with an optional phase difference;
wherein, relative to an optic axis of the αBBO crystal, the active transducers and the coherent driving source are configured to launch an acoustical wavefront normal to a plane, wherein the plane is
rotated in a range of 205±0.2 degrees from the optic axis and
rotated counter-clockwise in a range of 80±1.0 degrees from an a-axis of the αBBO crystal, or trigonal by 120 degrees from that rotation.

23. The AOD component of claim 22, wherein:
the active transducers and the coherent driving source are configured to induce the acoustical wavefront with a divergent angular spread of 1.8 to 2.2 degrees.

24. The AOD component of claim 22, wherein:
a signal from the coherent driving source to the active transducers is centered at 450 MHz, ±50 MHz.

25. The AOD component of claim 22, wherein:
the αBBO crystal includes an acoustical coupling surface that is parallel to a transducer plane that is
rotated in a range of 205±0.2 degrees from the optic axis and
rotated counter-clockwise in a range of 80±1.0 degrees from the a-axis of the αBBO crystal, or trigonal by 120 degrees from that rotation.

26. The AOD component of claim 22, wherein:
the acoustical wavefront launch is further configured to produce an acoustic transmission speed in a direction of the launch of 944±3 meters per second.

* * * * *